US010998915B2

(12) United States Patent
Moreira et al.

(10) Patent No.: US 10,998,915 B2
(45) Date of Patent: May 4, 2021

(54) DIGITAL-TO-ANALOG CONVERTER CIRCUIT, A METHOD FOR OPERATING THE SAME, AN APPARATUS AND A METHOD FOR CONTROLLING A DIGITAL-TO-ANALOG CONVERTER CELL

(71) Applicant: INTEL IP CORPORATION, Santa Clara, CA (US)

(72) Inventors: Jose Pedro Diogo Faisca Moreira, Munich (DE); Joerg Fuhrmann, Linz (AT); Patrick Ossmann, Jaerfaella (SE); Harald Pretl, Schwertberg (AT)

(73) Assignee: Intel IP Corporation, Santa Clara, CA (US)

( * ) Notice: Subject to any disclaimer, the term of this patent is extended or adjusted under 35 U.S.C. 154(b) by 94 days.

(21) Appl. No.: 16/321,484

(22) PCT Filed: Sep. 2, 2016

(86) PCT No.: PCT/IB2016/055270
§ 371 (c)(1),
(2) Date: Jan. 29, 2019

(87) PCT Pub. No.: WO2018/042231
PCT Pub. Date: Mar. 8, 2018

(65) Prior Publication Data
US 2020/0343903 A1      Oct. 29, 2020

(51) Int. Cl.
| | | |
|---|---|---|
| H03M 1/66 | (2006.01) | |
| H03M 1/74 | (2006.01) | |
| H04B 1/04 | (2006.01) | |

(52) U.S. Cl.
CPC .............. *H03M 1/747* (2013.01); *H04B 1/04* (2013.01)

(58) Field of Classification Search
CPC ............ H03M 1/747; H03M 1/66; H04B 1/04
(Continued)

(56) References Cited

U.S. PATENT DOCUMENTS

| 5,508,702 A * | 4/1996 | Estrada ................. H03M 1/745 |
| | | 341/136 |
| 7,489,261 B1 * | 2/2009 | Kuttner ............... H03M 1/0614 |
| | | 341/136 |

(Continued)

FOREIGN PATENT DOCUMENTS

EP        2999116 A1       3/2016

OTHER PUBLICATIONS

Amir Agah et al: "A 42 to 47GHz, 8-bit I/Q digital-to-RF converter with 21-dBm Psat and 16% PAE in 45-nm SOI CMOS", Radio Frequency Integrated Circuits Symposium (RFIC), 2013 IEEE, IEEE, Jun. 2, 2013 (Jun. 2, 2013), pp. 249-252, XP032443949.

(Continued)

*Primary Examiner* — Jean B Jeanglaude
(74) *Attorney, Agent, or Firm* — 2SPL Patentanwaelte PartG mbB

(57) ABSTRACT

A digital-to-analog converter circuit including one or more digital-to-analog converter cells and a separate voltage protection circuit connected by a common output node. A first digital-to-analog converter cell includes a first transistor which is configured to be switched to a conductive state when the first digital-to-analog converter cell is activated. A first terminal of the first transistor is coupled to a defined potential, wherein a second terminal of the first transistor is coupled to a common output node of the one or more digital-to-analog converter cells. The digital-to-analog converter circuit further includes a voltage protection circuit coupled between the common output node of the one or more digital-to-analog converter cells and an output node of (Continued)

the digital-to-analog converter circuit to regulate a voltage between the common output node and the defined potential.

25 Claims, 9 Drawing Sheets

(58) Field of Classification Search
USPC .......................................................... 341/144
See application file for complete search history.

(56) References Cited

U.S. PATENT DOCUMENTS

| | | | | |
|---|---|---|---|---|
| 7,675,442 | B2* | 3/2010 | Kuttner | H03M 1/0614 |
| | | | | 341/136 |
| 7,944,381 | B2* | 5/2011 | Kuttner | H03M 1/0614 |
| | | | | 341/136 |
| 8,653,995 | B2* | 2/2014 | Kuttner | H03M 1/1057 |
| | | | | 341/136 |
| 9,350,372 | B2* | 5/2016 | Chang | H03M 1/0827 |
| 9,379,883 | B1* | 6/2016 | Kuttner | H03M 1/0863 |
| 9,985,641 | B1* | 5/2018 | Ray | H03M 1/108 |
| 2002/0097174 | A1* | 7/2002 | Moon | H03M 1/745 |
| | | | | 341/136 |
| 2003/0001766 | A1* | 1/2003 | Song | H03M 1/687 |
| | | | | 341/145 |
| 2009/0128383 | A1* | 5/2009 | Kuttner | H03M 1/0614 |
| | | | | 341/136 |
| 2010/0141327 | A1* | 6/2010 | Kuttner | H03M 1/0614 |
| | | | | 327/427 |
| 2011/0285453 | A1* | 11/2011 | Kuttner | H03M 1/1057 |
| | | | | 327/427 |
| 2013/0084816 | A1 | 4/2013 | Gomez et al. | |

OTHER PUBLICATIONS

Joerg Fuhrmann: "A Digital Power Amplifier in 28 nm CMOS for LTE Applications", Apr. 25, 2016 (Apr. 25, 2016), pp. 1-190, FAU Studien aus der Elektrotechnik 6, FAU University Press, XP055395720.

Doorn T S et al: "An audio FIR-DAC in a BCD process for high power class-D amplifiers", Solid-State Circuits Conference, 2005. ESSCIRC 2005. Proceedings of the 31st European, IEEE, Piscataway, NJ, USA, Sep. 12, 2005 (Sep. 12, 2005), pp. 459-462, XP010855001.

Alavi Morteza S et al: "A Wideband 2$/times$ 13-bit All-Digital I/Q RF-DAC", IEEE Transactions on Microwave Theory and Techniques, IEEE Service Center, Piscataway, NJ, US, vol. 62, No. 4, Apr. 1, 2014 (Apr. 1, 2014), pp. 732-752, XP011544292.

Debopriyo Chowdhury et al: "A Fully-Integrated Efficient CMOS Inverse Class-D Power Amplifier for Digital Polar Transmitters", IEEE Journal of Solid-State Circuits, vol. 47, No. 5, May 2012; pp. 1-10.

Sang-Min Yoo et al: "A Class-G Switched-Capacitor RF Power Amplifier", IEEE Journal of Solid-State Circuits, vol. 48, No. 5, May 2013, pp. 1212-1224.

* cited by examiner

DIGITAL-TO-ANALOG CONVERTER CIRCUIT, A METHOD FOR OPERATING THE SAME, AN APPARATUS AND A METHOD FOR CONTROLLING A DIGITAL-TO-ANALOG CONVERTER CELL

FIELD

Examples relate to digital-to-analog conversion. In particular, examples relate to a Digital-to-Analog Converter (DAC) circuit and a method for operating the same. Further examples relate to an apparatus and a method for controlling a DAC cell of a DAC circuit.

BACKGROUND

Due to the down-scaling of Complementary Metal-Oxide-Semiconductor (CMOS) technologies, Digital Power Amplifiers (DPAs) have become feasible for Radio Frequency (RF) applications. DPAs may, e.g., be used for System-on-a-Chip (SoC) products for Internet of Things (IoT) or Machine to Machine (M2M) cellular communications (e.g. on Long Term Evolution, LTE, Cat-0).

A DPA comprises a cell field and a decoder, which determines for each clock period which cells must be active based on the envelope of the RF signal to be amplified. Active cells are switched on the basis of a Local Oscillator (LO) signal. The outputs of the cell field are connected to an Output Matching Network (OMN), which may be an LC network, a transformer or a power combiner. However, the OMN may also comprise further elements.

One option for implementing a DPA for RF applications is the Switched Capacitor (SC) DAC technique. An SC RF DAC provides ideally linear Amplitude Modulation—Amplitude Modulation (AM-AM) characteristics and constant Amplitude Modulation—Phase Modulation (AM-PM) characteristics, i.e., a potentially high linearity. SC RF DACs have proven to be feasible as transmitter output stages and as DPAs for low or medium power applications (e.g. Bluetooth, WiFi). However, for cellular applications, where very high power is required, the SC approach shows shortcomings.

Since the switching capacitance must scale with the required output power (assuming constant supply voltage), blocking capacitance, switches, buffers must also be scaled in order to maintain performance. Hence, the size of an SC RF DAC increases with the required output power. As size increases, the length of distribution signals and power lines increases as well as the associated parasitic series inductance. Hence, LC products increase dramatically, so that obtaining well matched delays across the whole DAC cell field gets difficult. Supply impedance becomes more critical due to increased supply current and larger blocks. Hence, obtaining low enough supply impedance both at RF and at the modulation frequencies gets challenging. The alternative solution of increasing the supply voltage is also problematic since NMOS (towards VSS) as well as PMOS (towards VDD) switches must be realized with transistor stacks. Hence, switch impedance, complexity of the DAC unit cell and the supply concept become critical.

These shortcomings may lead to excessive AM-PM (and many times also AM-AM) distortions at already moderate output power levels. Moreover, due to the high complexity and size of the cell field, leakage of LO signals to the output of the DPA may occur. Critical system specifications like Adjacent Channel Leakage Ratio (ACLR) or Error Vector Magnitude (EVM) may get out of control as the output power of the DPA moves up to the power range of cellular applications, where the PA may deliver around 2 Watt saturated power.

These problems may be partly overcome with a Switched Current (SI) DPA. The possibility of using open-drain transistor stacks allows a few (e.g. 3) times higher voltage swing at the same supply voltage. Moreover, open-drain NMOS stacks may be made smaller and more efficient than complementary PMOS-NMOS switches. In a SC RF DPA the capacitors must be arranged inside the cell field (i.e. in each DAC unit cell), whereas in a SI RF DPA all passive elements may be placed outside the cell field. The very large cell field of a SC RF DPA for a cellular phone usually requires the design of a power combiner which is tricky and may decrease efficiency. For a SI RF DPA, a simple transformer may be enough. These factors allow the design of SI RF DPAs with considerably better performance than their SC counterparts when Watt-level output powers are required.

However, also conventional SI RF DPA comprise a cell field of large size and high complexity. This may still lead to significant LO leakage, distortions and far-off noise caused by highorder Differential Non-Linearity (DNL).

Hence, there may be a desire for an improved SI DPA concept.

BRIEF DESCRIPTION OF THE FIGURES

Some embodiments of apparatuses and/or methods will be described in the following by way of example only, and with reference to the accompanying figures, in which.

DETAILED DESCRIPTION

Figure 1:
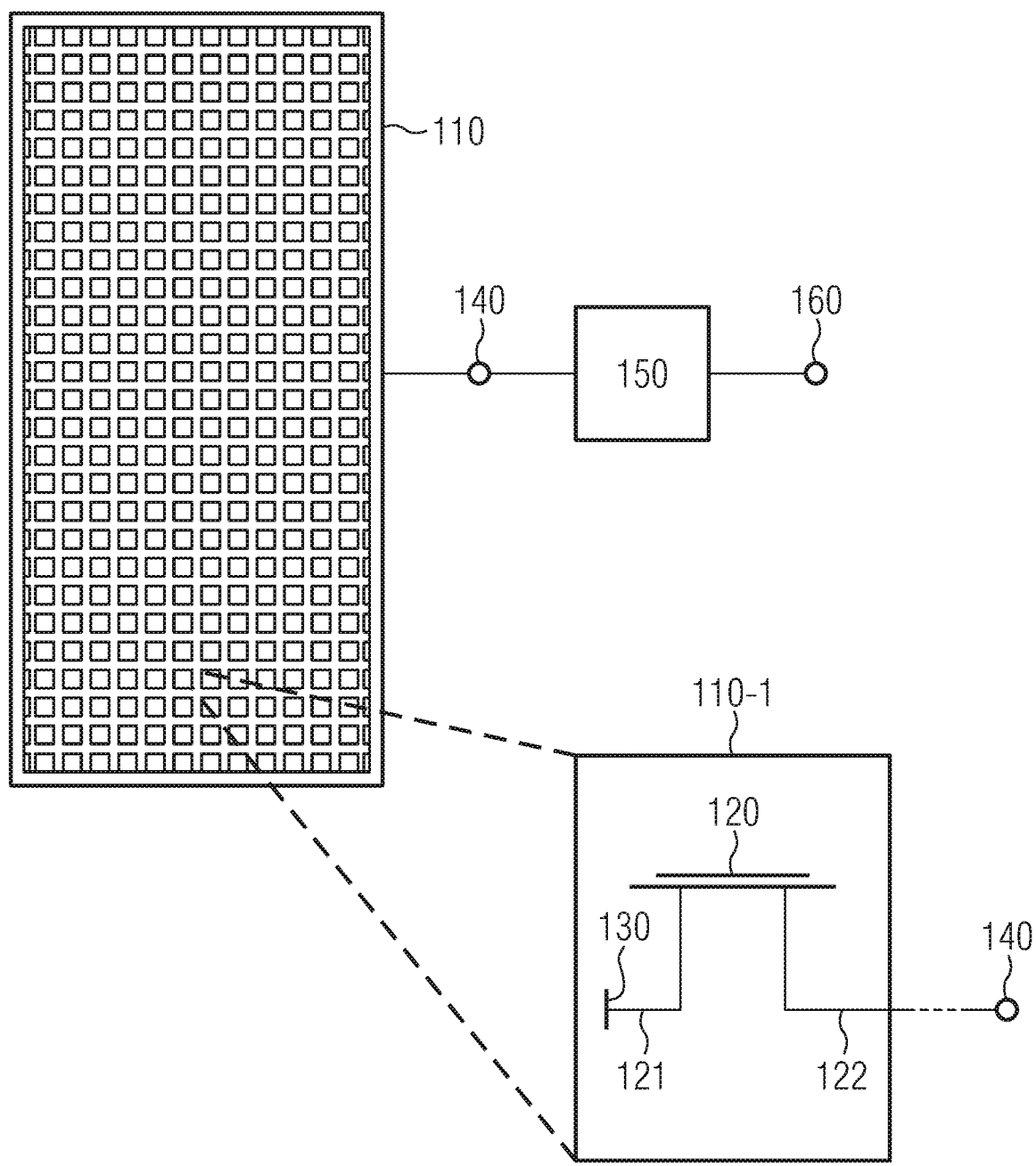
FIG. 1 illustrates an example of a DAC circuit.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements.

The terminology used herein is for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong, unless expressly defined otherwise herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), LTE or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 illustrates a DAC circuit 100. The DAC circuit 100 comprises one or more (e.g. a plurality of) DAC cells 110.

A first DAC cell 110-1 of the one or more DAC cells 110 comprises a first transistor 120 (e.g. an n-type or a p-type transistor). The first transistor 120 of the first DAC cell 110-1 is configured to be switched to a conductive state when the first DAC cell 110-1 is activated. For example, the first transistor 120 may be switched alternatingly between a non-conductive state and the conductive state during a transmission time interval, when the first DAC cell 110-1 is activated. A first terminal 121 of the first transistor 120 is coupled to a defined potential 130 (e.g. ground or a pre-defined voltage level), whereas a second terminal 122 of the first transistor 120 is coupled to a common output node 140 of the one or more DAC cells 110.

The common output node 140 is an output node of the one or more DAC cells 110 to which the individual cell outputs of the one or more DAC cells 110 are coupled to. For example, all of a plurality of DAC cells 110 may be connected to the common output node 140, all DAC cells of cell row of a plurality of DAC cells 110 may be connected to the common output node 140, or all DAC cells of cell column of a plurality of DAC cells 110 may be connected to the common output node 140.

A voltage protection circuit 150 is coupled between the common output node 140 of the one or more DAC cells 110 and an output node 160 of the DAC circuit 100. The output node 160 is a node which supplies the output signal of the DAC circuit 100 to further processing elements (e.g. an inductance matching circuit). The voltage protection circuit 150 is configured to regulate (e.g. limit) a voltage between the common output node 140 and the defined potential 130.

The voltage protection circuit 150 protects the first DAC cell 110-1 from voltage stress due to high voltage swings at the output node 160 of the DAC circuit 100. In conventional DAC circuits, voltage protections are realized in each DAC cell individually. Hence, each (unit) DAC cell exhibits high complexity rather and large size. In contrast, DAC circuit 100 divides the switching in the DAC cells and the voltage protection. Accordingly, the DAC circuit 100 may be operated with high voltage swings (as, e.g., required for cellular applications), while the first DAC cell 110-1 may be of small size and low complexity since the voltage protection of the individual DAC cell is moved out of the DAC cell field.

Accordingly, the DAC cell field for the plurality of DAC cells 110 may be implemented with minimum size and routing complexity. This may allow to decrease the length of signal and power supply lines. Therefore, delays may be much smaller. Moreover, differences between delays may be made smaller. Also inequalities in signal and power supply between DAC (unit) cells may be minimized (e.g. local oscillator driving). Moreover, the smaller cell field may allow maximized (improved) matching between the DAC cells. This may further enable reduced AM-AM and AM-PM distortion, so that ACLR and far-off noise (caused by highorder DNL) may be reduced.

Also local oscillator leakage to the output node of the DAC circuit 100 may be significantly decreased compared to conventional approaches. Accordingly the EVM may be influenced beneficially. This is due to the fact that supply lines for the local oscillator signals may be kept far away from the output lines of the DAC circuit 100. In other words, the voltage protection circuit 150 may allow to separate the supply lines for the local oscillator signals from the output node 160 of the DAC circuit 100. This in contrast to conventional approaches, where all DAC unit cells are connected to both the supply lines for the local oscillator signals and the output lines of the DAC. Moreover, DAC circuit 100 may allow for shorter control logic lines, so that a current consumption of the DAC circuit 100 may be reduced compared to conventional approaches.

Generally speaking, some examples relate to a means for digital-to-analog conversion. The means for digital-to-analog conversion comprises one or more (e.g. a plurality of) cellular means for digital-to-analog conversion. A first cellular means for digital-to-analog conversion comprises a first means for switching which is configured to be switched to a conductive state when the first cellular means for digital-to-analog conversion is activated, wherein a first terminal of the first means for switching is coupled to a defined potential, and wherein a second terminal of the first means for switching is coupled to a common output node of the one or more cellular means for digital-to-analog conversion. The means for digital-to-analog conversion further comprises a means for voltage protection coupled between the common output node of the one or more cellular means for digital-to-analog conversion and an output node of the means for digital-to-analog conversion. The means for voltage protection is configured to regulate (e.g. limit) a voltage between the common output node and the defined potential.

In some examples, the first cellular means for digital-to-analog conversion may further comprise a means for selectively coupling a current source to the common output node.

The means for digital-to-analog conversion may be implemented by a DAC circuit described above or below (e.g. FIG. 1). The cellular means for digital-to-analog conversion may be implemented by a DAC cell described above or below (e.g. FIG. 1). The means for switching may be implemented by a first transistor described above or below (e.g. FIG. 1). The means for voltage protection may be implemented by a voltage protection circuit described above or below (e.g. FIG. 1).

Figure 2:
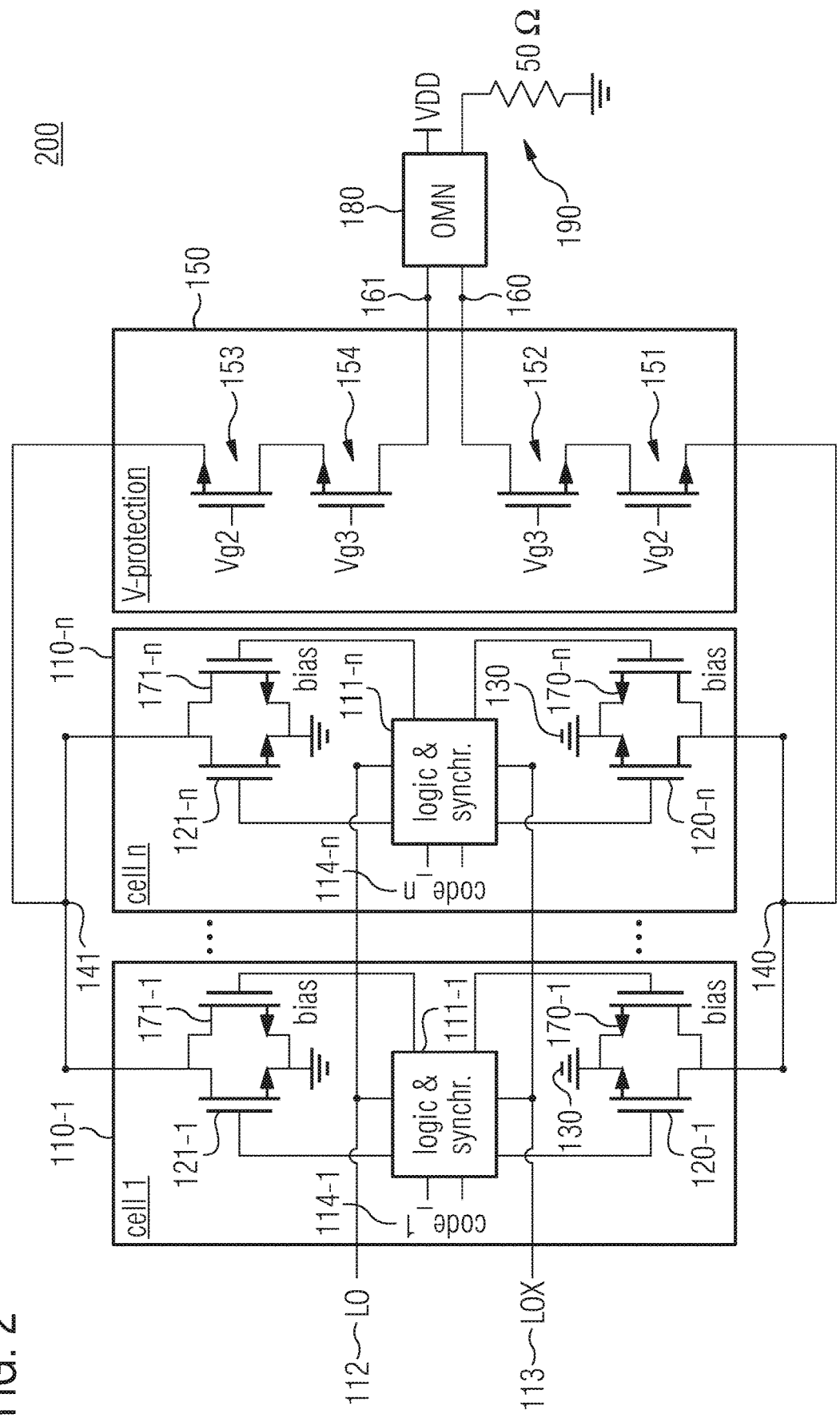
FIG. 2 illustrates another example of a DAC circuit.

In FIG. 2, another DAC circuit 200 is illustrated. The DAC circuit 200 comprises a plurality of DAC cells 110-1, ..., 110-n. For the sake of clarity, merely two DAC cells 110-1 and 110-n are illustrated in FIG. 2. The plurality of DAC cells 110-1, ..., 110-n are coupled to a common output node 140 of the plurality of DAC cells. As indicated for DAC cells 110-1 and 110-n, each DAC cell comprises a respective transistor 120-1, ..., 120-n which is configured to be switched to a conductive state when the respective DAC 110-1, ..., 110-n cell is activated. A first terminal of the respective transistor 120-1, ..., 120-n is coupled to a defined potential 130 (e.g. ground as indicated in FIG. 2). The first terminals of the respective switched transistors of the plurality of DAC cells 110-1, ..., 110-n are coupled to the same defined potential (e.g. ground). A second terminal of the respective transistor 120-1, ..., 120-n is coupled to the common output node 140 of the plurality of DAC cells 110-1, ..., 110-n.

A voltage protection circuit 150 is coupled between the common output node 140 of the plurality of DAC cells 110-1, ..., 110-n and an output node 160 of the DAC circuit 200. The voltage protection circuit 150 is configured to regulate (e.g. limit) a voltage between the common output node 140 and the defined potential 130. Therefore, the voltage protection circuit 150 may comprises one or more transistors coupled in series between the common output node 140 of the plurality of DAC cells 110-1, ..., 110-n and the output node 160 of the DAC circuit 200 as illustrated in FIG. 2. In FIG. 2, two transistors 151 and 152 are coupled in series between the common output node 140 and the output node 160. However, it is to be noted that any number of transistors may be used. For example, 1, 2, 3, 4, 5, 6, 7, 8, 9, 10, 12, 16, or more transistors may be coupled in series between the common output node 140 and the output node 160.

Control terminals of the voltage protection circuit's one or more transistors may be configured to be coupled to respective defined potentials (Vg2 and Vg3 in FIG. 2). This may allow common gate operation of these transistors. The defined potential may be a fix DC voltage, or a combination of a fix DC voltage and an AC swing (e.g. an RF swing) due to, e.g., resistive coupling to a voltage source and capacitive coupling to the output node 160.

The transistors 151 and 152 of the voltage protection circuit 150 and the transistors 120-1, ..., 120-n of the respective DAC cells 110-1, ..., 110-n form respective transistor stacks. However, compared to conventional approaches, the cascoded transistors are split up into two parts in the DAC circuit 200. The bottom part of the transistor stack (which has the switching function) is grouped together with the corresponding parts of the other DAC unit cells to build up the DAC cell field. The top part of the transistor stack (which allows operation with high voltage swings without damaging the devices) is grouped together with the corresponding parts of the other DAC unit cells and is moved out of the DAC cell field. Hence, switching DAC cells or groups of DAC cells in one part of the DAC circuit 200 is independent from the switching in the other part of the DAC circuit 200 (i.e. the voltage protection circuit 150). That is, dimensions of each part of the DAC circuit 200 may be dynamically reconfigured and be independent from the other part. Also the layout of the upper part of the transistor stack (which is moved out of the DAC cell field) may be simplified and reduced in size since all devices are of the same type. For example, thick oxide or DEMOS transistors may be used in the voltage protection circuit 150, whereas thin oxide transistors may be used in the DAC cells. Hence, a compact layout and improved matching between the DAC (unit) cells may be allowed.

In other words, each unit cell contains a transistor stack in order to obtain the necessary robustness against high output voltage swings in a traditional SI DPA. In the DAC circuit 200, all elements that are not strictly necessary for the DAC function are moved out of the DAC cell.

The DAC cells 110-1, ..., 110-n further comprise respective cell control modules 111-1, ..., 111-n for switching the respective transistor 120-1, ..., 120-n to the conductive state based on an oscillation signal 112. For example, the first DAC cell 110-1 comprises the cell control module 111-1 which is configured to switch the transistor 120-1 to the conductive state based on the oscillation signal 112. The cell control module 111-1 may, e.g., be configured to alternatingly switch the transistor 120-1 between a non-conductive state and the conductive state during a transmission time interval, when the first DAC cell 110-1 is activated.

The activation of a DAC cell may be signalized to the respective cell control module 111-1, ..., 111-n by respective enable signals 114-1, ..., 114-n. For example, the enable signals 114-1, ..., 114-n may be generated by a decoder (not illustrated) of the DAC circuit 200. The decoder may generate the enable signals 114-1, ..., 114-n based on a digital amplitude signal (e.g. provided by a baseband processing element). Hence, a number of activated DAC cells may be selected based on the digital amplitude control signal. On the contrary, also a number of de-activated DAC cells may be selected based on the digital amplitude control signal.

In order to bias the voltage protection circuit 150, the DAC cells 110-1, ..., 110-n further comprise respective switchable current sources 170-1, ..., 170-n which are coupled to the common output node 140 of the plurality of DAC cells. This may allow to keep the transition frequency of the transistors 151, 152 (i.e. the top part of the respective transistor stack) well above the RF frequency of the output signal at the output node 160. Accordingly, AM-AM distortions as well as AM-PM distortions may be reduced. That is, the switchable bias-current component in the DAC (unit) cells may allow for maximizing the efficiency.

As indicated, each switchable current source 170-1, ..., 170-n may, e.g., comprises (be) a transistor coupled between the defined potential 130 and the common output node 140. The additional chip area for the current sources (i.e. the transistors 170-1, ..., 170-n in FIG. 2) may be negligible since these devices are all of the same type and much smaller than the switching transistors 120-1, ..., 120-n.

The respective switchable current sources 170-1, ..., 170-n are configured to supply a bias current to the common output node 140 (only) when the respective DAC cells 110-1, ..., 110-n are de-activated. That is, the switchable current source 170-1 is configured to supply a bias current to the common output node 140 (only) when the first DAC cell 110-1 is de-activated. In other words, the switchable current source 170-1 is configured to not supply a bias current to the common output node 140 only when the first DAC cell 110-1 is activated. The switchable current source may be configured to adjust a value of the bias current.

However, as indicated in FIG. 2, also the other (i.e. further) DAC cells of the plurality of DAC cells 110-1, ..., 110-n comprise respective switchable current sources. Hence, they need to be controlled. A number of switchable current sources supplying the bias current to the common output node 140 may, e.g., be selected based on a digital amplitude control signal. For example, the digital amplitude control signal may be supplied to a decoder of the DAC circuit 200 which provides the enable signals 114-1, ..., 114-n for the individual DAC cells to the respective cell control modules 111-1, ..., 111-n. Hence, the cell control modules 111-1, ..., 111-n may further be configured to control the switchable current source of the respective DAC cells 110-1, ..., 110-n. Since the switchable current sources supply the bias current to the common output node 140 only when their respective DAC cell 110-1, ..., 110-n is deactivated, a bias current is supplied to the voltage protection circuit 150 which depends on the instant value of the envelope of the RF output signal at the output node 160 of the DAC circuit 200. This may allow to increase efficiency since a minimum bias current for the voltage protection circuit 150 may be ensured.

In other words, transistor stacking is used for robustness against voltage stress. All stack transistors need suitable biasing. Therefore, digital controlled current sources (in its simplest implementation just a single transistor as illustrated in FIG. 2) may be added to the DAC (unit) cell. They may be switched off/on as the DAC (unit) cell is turned on/off, respectively. This current sources bias the (high-)voltage protection circuit which is connected between the common output node of the cell field and the output of the DPA. For high efficiency, the current sources may be dynamically switched off (for strong signals) and on (for weak signals) (i.e. dependent on the instant value of the envelope of the RF signal). In order to minimize DNL, each DAC unit cell in the bottom part of the transistor stack may be provided with a switchable current source, which is turned off when the cell is activated. Hence, a smooth variation of the bias current which is synchronized with the amplitude control signal (AM signal) may be enabled. This procedure may allow for high efficiency and linearity.

While the above description illustrated the general features, it is to be noted that the DAC circuit 200 illustrated in FIG. 2 is implemented differentially. Accordingly, the DAC cells as well as the voltage protection circuit are adapted to differential operation. In order to shorten the discussion of the complementary features of the DAC cells and the voltage protection circuit, it is only referred to additional elements of the first DAC cell 110-1 and the voltage protection circuit 150.

The first DAC cell 110-1 further comprises a second transistor 121-1 which first terminal is coupled to the defined potential 130 and which second terminal is coupled to a second common output node 141 of the plurality of DAC cells 110-1, ..., 110-n. The second transistor 121-1 is configured to be switched to the conductive state when the first DAC cell 110-1 is activated. As indicated in FIG. 2, the cell control module 111-1 may be configured to switch the second transistor 121-1 to the conductive state based on a second oscillation signal 113.

The voltage protection circuit 150 is further coupled between the second common output node 141 and the output node 160 of the DAC circuit 200. Again, the voltage protection circuit 150 is configured to regulate (e.g. limit) a voltage between the second common output node 141 and the defined potential 130.

The first DAC cell 110-1 further comprises a second switchable current source 171-1 coupled to the second common output node 141. Again, the second switchable current source 171-1 is configured to supply a bias current to the second common output node 141 only when the first DAC cell is de-activated. As indicated in FIG. 2, the second switchable current source 171-1 may comprise (be) a transistor coupled between the defined potential 130 and the second common output node 141. The cell control module may further be configured to control the second switchable current source 171-1. Accordingly, the second switchable current source 171-1 may allow to bias the voltage protection circuit 150.

The voltage protection circuit 150 may comprise one or more transistors coupled in series between the second common output node 141 and the output node 160 of the DAC circuit. As indicated in FIG. 2, the voltage protection circuit 150 may comprise two transistors 153, 154. However, as for the series of transistors between the common output node 140 and the output node 160, any number of transistors may be used. Like for transistors 153 and 154, control terminals of the voltage protection circuit's one or more transistors between the second common output node 141 and the output node 160 may be configured to be coupled to respective defined potentials (here Vg2 and Vg3), so that a common gate operation of these transistors is enabled.

In order to allow for differential operation, the cell control module 111-1 is configured to switch only one of the transistor 120-1 and the second transistor 121-1 of the first DAC cell 110-1 to the conductive state at the same time. For example, cell control module 111-1 may switch the transistor 120-1 based on the first oscillation signal 112, and the second transistor 121-1 based on the (inverse) second oscillation signal 113. Accordingly, a differential output signal may be provided at the output nodes 160 and 161 of the DAC circuit 200.

A matching circuit 180 may be coupled to the DAC circuit 200 as indicated in FIG. 2. The matching circuit 180 is configured to present a defined inductance to the DAC circuit 200. The matching circuit 180 may allow to couple the DAC circuit 200 with an antenna element which is indicated in FIG. 2 by a grounded resistor 190 with a resistance of 50Ω. The presented inductance may be adjustable (e.g. using switches) or fixed (i.e. selected by design of the matching circuit 180). The DAC circuit 200 and the matching circuit 180 may be arranged on the same semiconductor substrate, or alternatively on different semiconductor substrates. As indicated in FIG. 2, the supply voltage (VDD) for the DAC circuit 200 may be supplied via the matching circuit 180.

In other words, the outputs of the DPA may be connected to an on-chip output impedance matching network consisting of a transformer and capacitors. The supply voltage for the open-drain DPA may be supplied through the central tap of the primary of the transformer as indicated in FIG. 2. In general, the implementation of the matching network may be either on- or off-chip.

In this manner, an apparatus for providing a RF transmit signal may be provided which comprises a DAC circuit according to the proposed concept or one or more examples described. The DAC circuit generates an analog RF transmit signal based on a digital baseband transmit signal. The matching circuit is coupled to the DAC circuit and presents a defined inductance to the DAC circuit.

Figure 3:
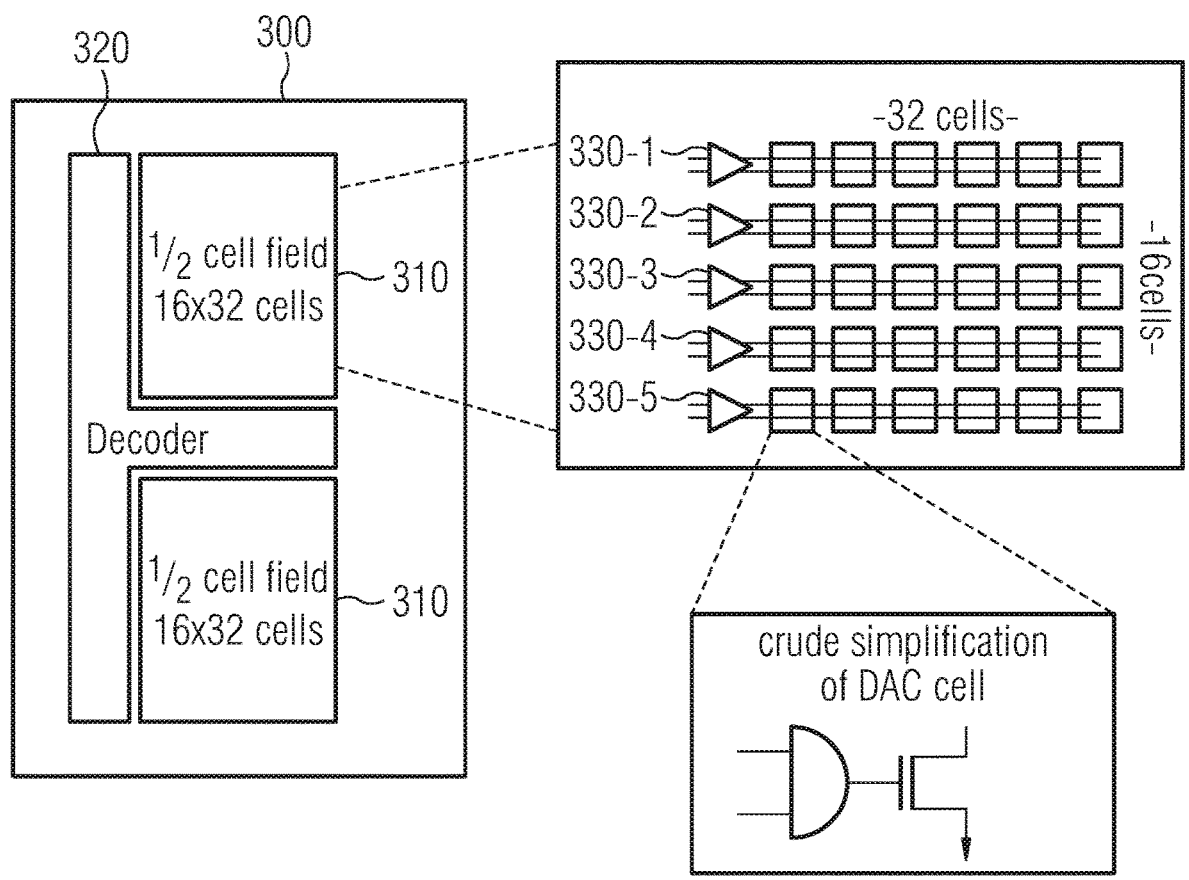
FIG. 3 illustrates still another example of a DAC circuit.

Another DAC circuit 300 is illustrated in FIG. 3. The DAC circuit 300 comprises a cell field 310 and a decoder 320. Since the cell field 310 comprises merely transistors of the bottom part of the transistor stack, the DAC circuit 300 as illustrated in FIG. 3 may be referred to as bottom part of a DPA. The decoder 320 uses a 10-bit thermometer code, so that a 10-bit thermometer coded DAC circuit 300 is provided. However, the decoder 320 is not limited to this type of code. In general any type of code may be used. The cell field 310 comprises 32 rows and 32 columns of DAC (unit) cells. However, in general, any number of DAC (unit) cells may be used per row/column. The cell field 310 is split up into two parts in order to decrease the length of the column control lines from the decoder 320 to the DAC (unit) cells. The oscillation signal is fed to a row of DAC (unit) cells from the left side and is buffered in a buffer 330-1, . . . , 330-32 at the beginning of each row. The cell field 310 may, e.g., have a single supply of 1.1 V.

As discussed above, a differentially implemented DAC (unit) cell comprises of three blocks: two switches (i.e. transistors), two switchable current sources and a logic block to control the above blocks.

Figure 4:
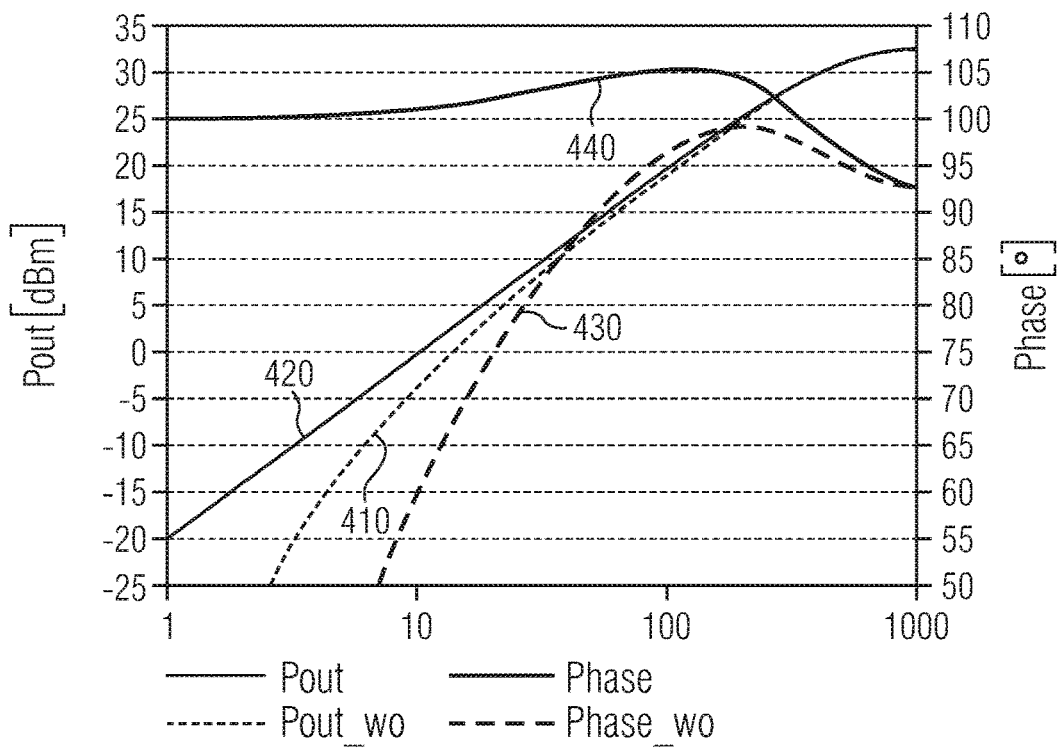
FIG. 4 illustrates an example of an AM-AM and an AM-PM characteristic of a DAC circuit.

The effect of the switchable current sources is illustrated in FIG. 4, which illustrates the AM-AM characteristic (distortion) and the AM-PM characteristic (distortion) of a DAC circuit according to the proposed concept. Curve 410 illustrates the output power of an output signal of the DAC circuit for an input signal of the DAC circuit with increasing amplitude. During operation, the switchable current sources according to the proposed concept are de-activated. Curve 420 illustrates a similar situation, in which the switchable current sources are activated. It is evident from FIG. 4, that the linearity of curve 420 is significantly greater than the linearity of curve 410. Hence, the switchable current sources according to the proposed concept allow for minimizing AM-AM distortions in the DAC circuit.

Similarly, curve 430 shows the phase behavior of the output signal of the DAC circuit when the switchable current sources according to the proposed concept are de-activated. Curve 440 shows again the situation, in which the switchable current sources are activated. It is evident from FIG. 4 that the phase is almost constant for curve 430, whereas a huge phase movement is illustrated by curve 430. Hence, the switchable current sources according to the proposed concept allow for minimizing AM-PM distortions in the DAC circuit. That is, an efficiency of the DAC circuit may be improved.

If the current sources were not switchable, current consumption might be significantly increased (e.g. in the order of 10 to 20%). Furthermore, far-off noise due to very high-order non-linearity may be minimized by switching the current sources simultaneously with the activation of the DAC (unit) cell: When the DAC cell is not active, the current sources provide a constant current—when the DAC cell is activated, the current sources are switched off. As indicated above, the value of the constant current may optionally be made programmable for flexibility regarding, e.g., process variations or power back-off. This may be implemented using two or more pairs of current sources instead of only one per DAC cell, or by providing an adjustable current source (wherein also two or more current sources may be understood as sub-elements of a single adjustable current source of the DAC cell).

Figure 5:
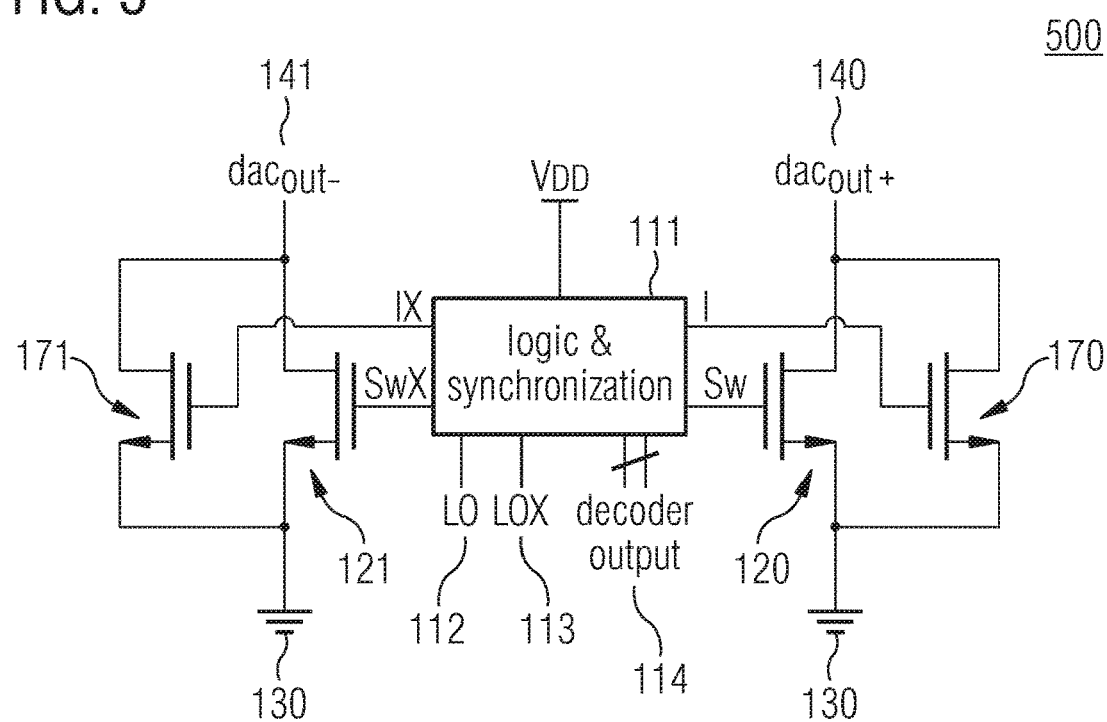
FIG. 5 illustrates an example of a DAC cell.
Figure 6:
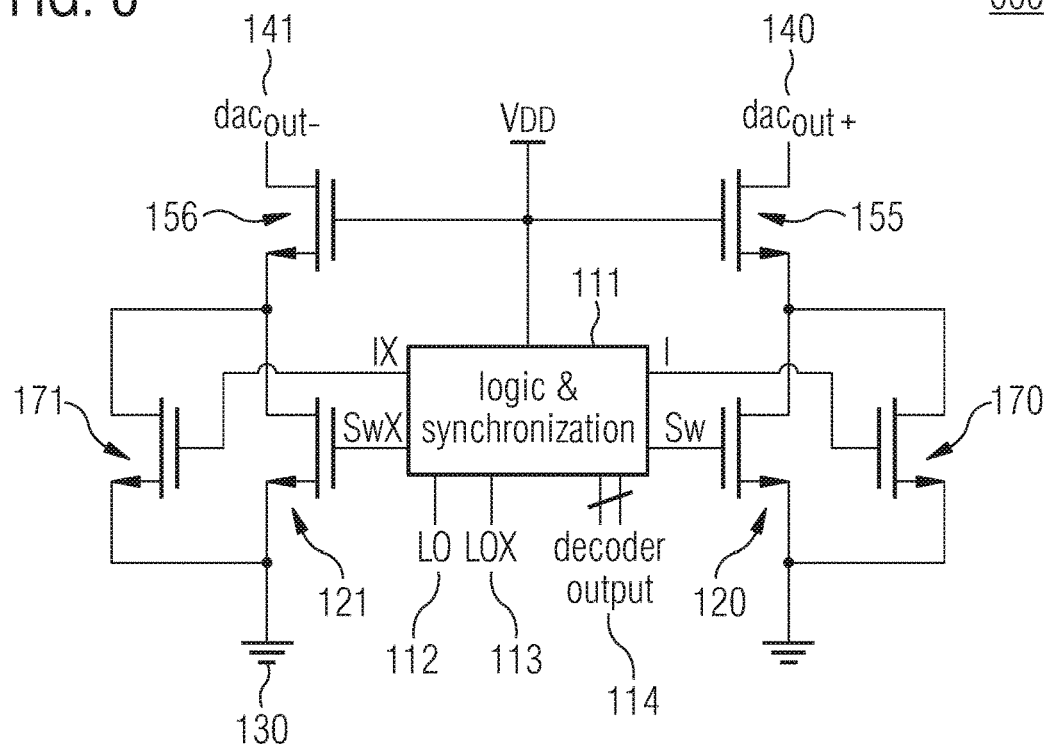
FIG. 6 illustrates another example of a DAC cell.
Figure 7:
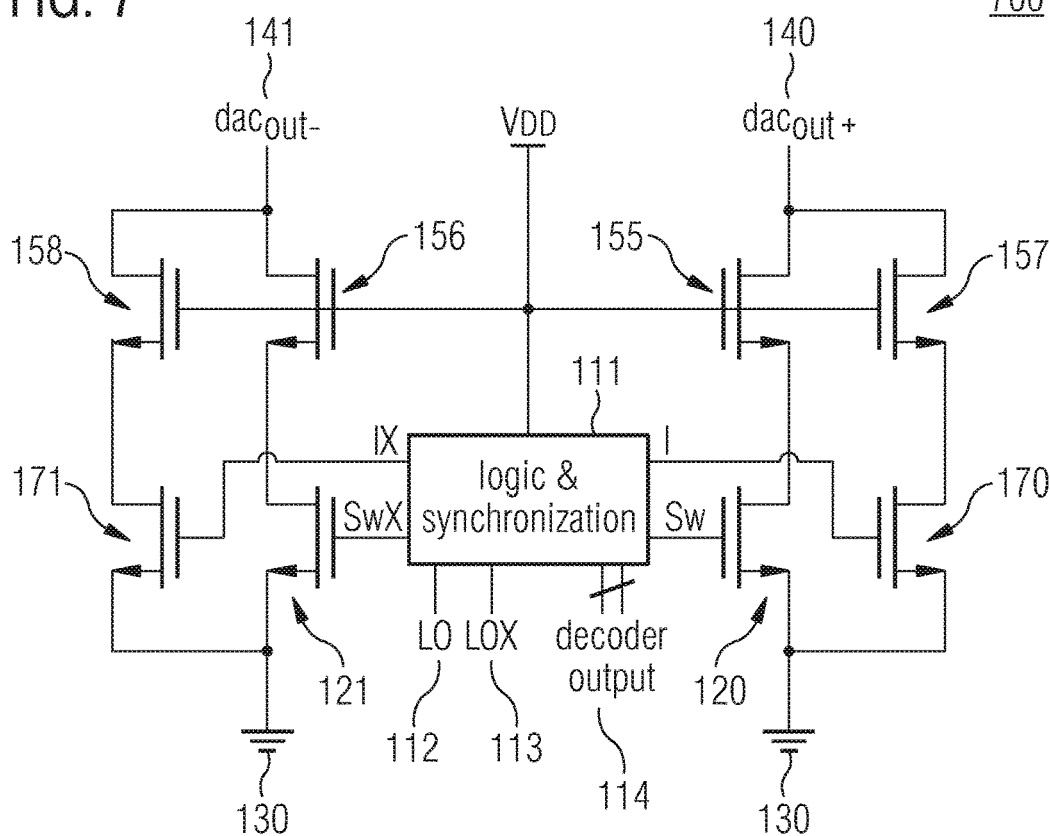
FIG. 7 illustrates still another example of a DAC cell.

In the following, FIGS. 5 to 7 illustrate different exemplary implementations for a DAC unit cell. All the illustrated exemplary implementations may allow a compact layout, so that the size of the DAC cell field may be several times smaller compared to conventional approaches.

FIG. 5 illustrates a DAC cell 500 as already illustrated above in FIG. 2 as part of the DAC circuit 200. The DAC cell 500 is implemented differentially. That is, it comprises transistor 120 and second transistor 121 which are configured to be switched to a conductive state when the DAC 500 cell is activated. The first terminal of the transistor 120 is coupled to the defined potential 130 (e.g. ground), whereas the second terminal of the transistor 120 is coupled to the common output node 140. The first terminal of the second transistor 121 is coupled to the defined potential 130, whereas the second terminal of the second transistor 121 is coupled to the second common output node 141.

A voltage between the common output node 140 and the defined potential 130, as well as between the second common output node 141 and the defined potential 130 is limited by a voltage protection circuit coupled to the common output node 140 and the second common output node 141 (see, e.g., FIG. 2 for details).

For biasing the voltage protection circuit, the switchable current source 170, which is coupled to the common output node 140, and the second switchable current source 171, which is coupled to the common output node 141, are provided. As indicated in FIG. 5, the switchable current source 170 and the second switchable current source 171 may be implemented by a respective transistor coupled between the defined potential 130 and the common output node 140, and between the defined potential 130 and the second common output node 141, respectively. The switchable current source 170 supplies a bias current to the common output node 140, and the second switchable current source 171 supplies a bias current to the second common output node 141 only when the DAC cell is 500 deactivated.

The cell control module 111 switches the transistor 120 to the conductive state based on the oscillation signal 112 and the enable signal 114 from the decoder, and switches the second transistor 121 to the conductive state based on the second oscillation signal 113 and the enable signal 114 from the decoder.

DAC cell 500 is an implementation with reduced size compared to conventional approaches.

Another DAC cell 600 is illustrated in FIG. 6. The DAC cell 600 is similar to DAC cell 500 illustrated in FIG. 5. However, the DAC cell 600 further comprises a second auxiliary voltage protection circuit 155 which is coupled between the transistor 120 of the DAC cell 600 and the common output node 140. The second auxiliary voltage protection circuit 155 is configured to regulate (e.g. limit) a voltage across the transistor 120 of the DAC cell 600. As indicated, the second auxiliary voltage protection circuit 155 may be implemented by an additional transistor coupled between the transistor 120 of the DAC cell 600 and the common output node 140. Since, the DAC cell 600 is implemented differentially, the DAC cell 600 further comprises a third auxiliary voltage protection circuit 156 which is coupled between the second transistor 121 of the DAC cell 600 and the second common output node 141. Similarly, the third auxiliary voltage protection circuit 156 is configured to limit a voltage across the second transistor 121 of the DAC cell 600. Again, the third auxiliary voltage protection circuit 156 may be implemented by an additional transistor coupled between the second transistor 121 of the DAC cell 600 and the second common output node 141.

Control terminals of the transistors comprised by the second and third auxiliary voltage protection circuits 155, 156 are coupled to a defined potential (e.g. VDD as indicated in FIG. 6).

Still another DAC cell 700 is illustrated in FIG. 7. The DAC cell 700 is similar to DAC cell 600 illustrated in FIG. 6. However, the DAC cell 700 further comprises a first auxiliary voltage protection circuit 157 coupled between the transistor of the switchable current source 170 and the common output node 140. The first auxiliary voltage protection circuit 157 is configured to regulate (e.g. limit) a voltage across the transistor of the switchable current source 170. As indicated, the first auxiliary voltage protection circuit 157 may be implemented by an additional transistor coupled between the transistor of the switchable current source 170 and the common output node 140. Since, the DAC cell 700 is implemented differentially, the DAC cell 700 further comprises a fourth auxiliary voltage protection circuit 158 coupled between the transistor of the second switchable current source 171 and the second common output node 141. Similarly, the fourth auxiliary voltage protection circuit 158 is configured to limit a voltage across the transistor of the second switchable current source 171. Again, the fourth auxiliary voltage protection circuit 158 may be implemented by an additional transistor coupled between the transistor of the second switchable current source 171 and the second common output node 141.

Control terminals of the transistors comprised by the first and fourth auxiliary voltage protection circuits 157, 158 are coupled to a defined potential (e.g. VDD as indicated in FIG. 7).

The DAC cells 600 and 700 offer a higher voltage robustness compared to DAC cell 500 without requiring additional supply or bias voltages. That is, a routing complexity of the DAC cell remains the same, whereas only the size (area) of the DAC cell field slightly increases. However, the slightly increased size of the DAC cell field may still be much smaller than for conventional topologies. The DAC cells 500, 600 and 700 may be used for DAC circuits according to the proposed circuit (e.g. as illustrated in FIGS. 1 to 3).

Figure 8:
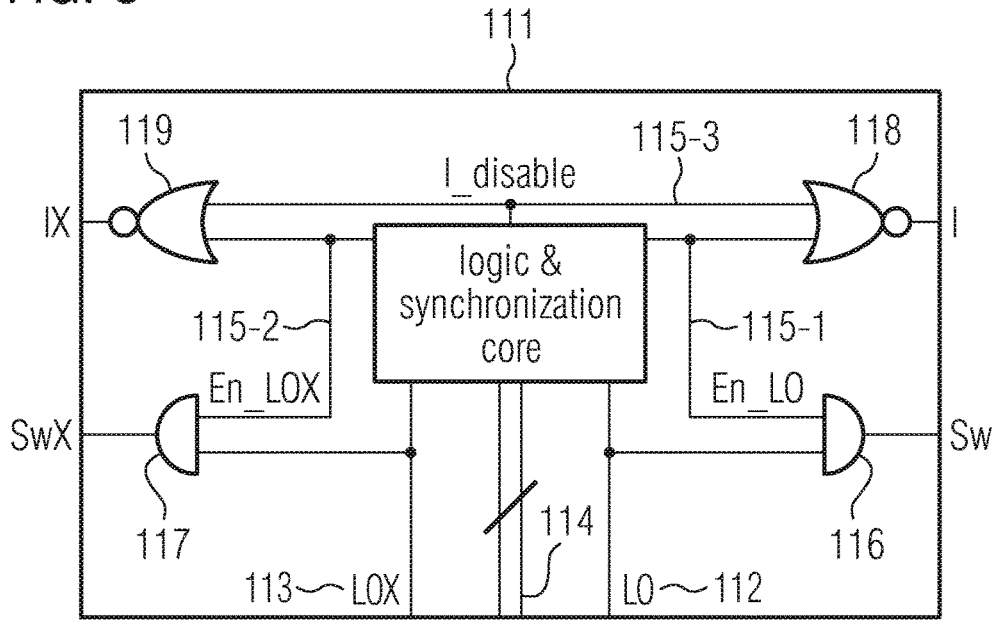
FIG. 8 illustrates an example of a cell control module for a DAC cell.

An exemplary implementation of the cell control module 111 as used in, e.g., the examples of FIGS. 2, 5, 6 and 7 is illustrated in FIG. 8. The cell control module 111 comprises an apparatus 115 for controlling a DAC cell. The apparatus 115 provides a signal 115-1 for controlling a first transistor of the DAC cell based on the enable signal 114 from the decoder and the first oscillation signal 112. Further, the apparatus 115 provides a signal 115-2 for controlling a second transistor of the DAC cell based on the enable signal 114 from the decoder and the second (inverse) oscillation signal 113.

The signal 115-1 is supplied to a first AND gate 116 by the apparatus 115. The first AND gate 116 further receives the first oscillation signal 112. Based on the signal 115-1 and the first oscillation signal 112, the first AND gate 116 provides a logical output signal for switching the first transistor of the DAC cell from the non-conductive state to the conductive state, and vice versa.

The signal 115-2 is supplied to a second AND gate 117 by the apparatus 115. The second AND gate 117 further receives the second oscillation signal 113. Based on the signal 115-2 and the second oscillation signal 113, the second AND gate 117 provides a logical output signal for switching the second transistor of the DAC cell from the non-conductive state to the conductive state, and vice versa.

The apparatus further generates a signal 115-3 for controlling the switchable current sources of the DAC cell. For example, the signal 115-3 indicates to switch off the switchable current source of the DAC cell even if the DAC cell is deactivated. This may be beneficial for power back-off.

The signal 115-1 is supplied together with the signal 115-3 to a first NOR gate 118 by the apparatus 115. Based on the signal 115-1 and the signal 115-3, the first NOR gate 118 provides a logical output signal for switching the first switchable current source of the DAC cell (which is related to the first switchable transistor of the DAC cell) on or off.

Similarly, the signal 115-2 is supplied together with the signal 115-3 to a second NOR gate 119 by the apparatus 115. Based on the signal 115-2 and the signal 115-3, the second NOR gate 118 provides a logical output signal for switching the second switchable current source of the DAC cell (which is related to the second switchable transistor of the DAC cell) on or off. It is evident that both switchable current sources of the DAC cell are switched on or off synchronously with the deactivation or activation of the DAC cell, respectively.

In the following, two exemplary implementations for an apparatus for controlling a DAC cell are discussed in connection with FIGS. 9 and 10. The apparatus discussed in connection with FIGS. 9 and 10 may, e.g., be used for the apparatus 115 for controlling a DAC cell illustrated in FIG. 8.

Figure 9:
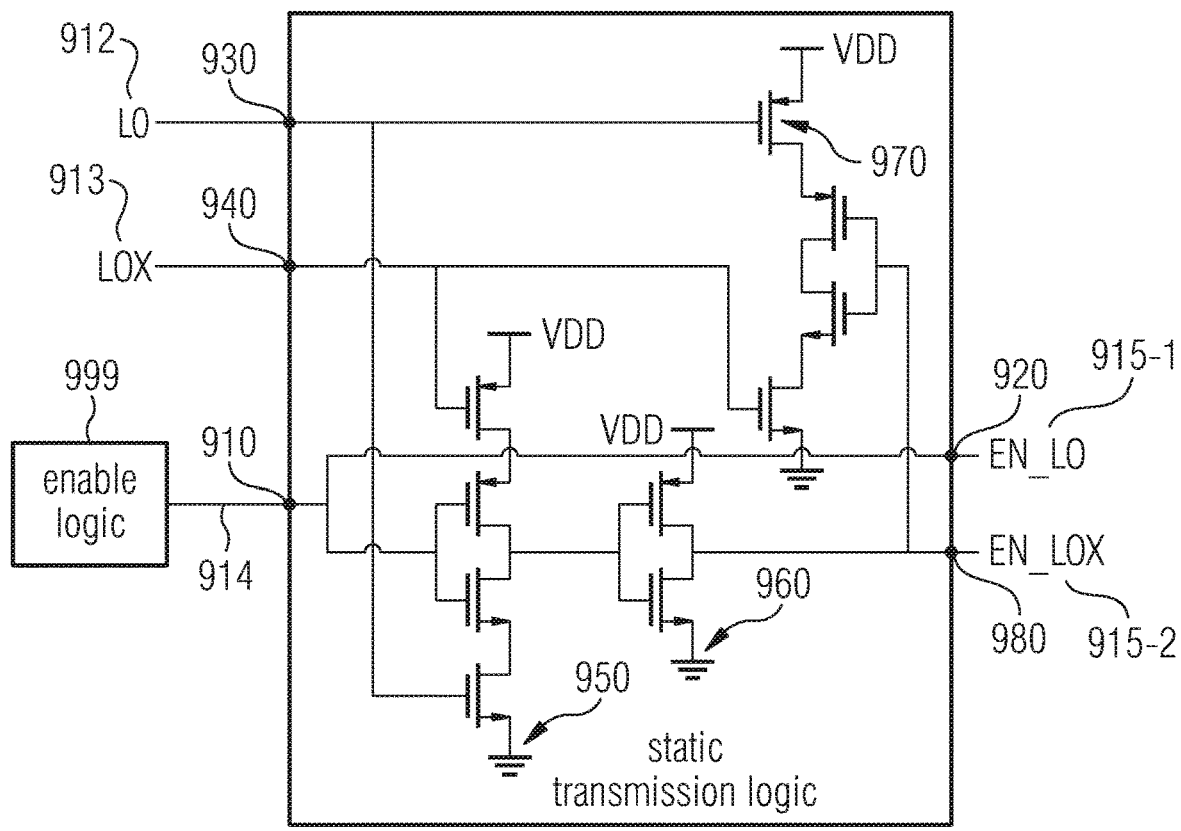
FIG. 9 illustrates an example of an apparatus for controlling a DAC cell.

FIG. 9 illustrates an apparatus 900 for controlling a DAC cell. The apparatus 900 comprises an input 910 configured to receive a state signal 914 indicative of an activation or de-activation of the DAC cell. As indicated in FIG. 9, the state signal 914 may be supplied from an enable logic 999 (e.g. a decoder of the DAC circuit). That is, the state signal 914 may be based on an output signal of a decoder of the DAC circuit.

Further, the apparatus 900 comprises a first output configured to supply the state signal 914 as a signal 915-1 for controlling a switched transistor of the DAC cell.

The apparatus 900 also comprises a second input 930 configured to receive the first oscillation signal 912, and a third input 940 configured to receive the second (inverse) oscillation signal 913.

The first oscillation signal 912 and the second oscillation signal 913 are supplied to control terminals of the outer ones of a first cascade 950 of four transistors, which is coupled between a supply voltage (VDD) and ground. The potential at the midpoint of the first cascade 970 is supplied to control terminals of a second cascade 960 of two transistors, which is coupled between the supply voltage and ground.

The first oscillation signal 912 and the second oscillation signal 913 are further supplied to control terminals of the outer ones of a third cascade 970 of four transistors. The control terminals of the inner two transistors of the third cascade 970 are coupled to the potential at the midpoint of the second cascade 960.

A second output 980 is further coupled to the potential at the midpoint of the second cascade 960 and the control terminals of the inner two transistors of the third cascade 970 in order to supply a signal 915 for controlling a second switched transistor of the DAC cell.

The apparatus 900 uses static logic to control the DAC cell. An implementation with dynamic logic is illustrated in FIG. 10. FIG. 10 illustrates another apparatus 1000 for controlling a DAC cell of a DAC circuit. The apparatus 1000 comprises an input configured to receive a state signal 1014 indicative of an activation or de-activation of the DAC cell. As indicated in FIG. 10, the state signal 914 may be supplied from an enable logic 1099 (e.g. a decoder of the DAC circuit). That is, the state signal 1014 may be based on an output signal of a decoder of the DAC circuit.

The apparatus 1000 further comprises a first output 1020 configured to supply the state signal 1014 as a signal 1015-1 for controlling a first signal generation element of the DAC cell (e.g. a first switched transistor).

Furthermore, the apparatus 1000 comprises two transistors 1030, 1040 of different conductivity types which are coupled in parallel (e.g. an n-type transistor and a p-type transistor). Input terminals 1031, 1041 of the transistors 1030, 1040 are coupled to the input 1010. One of the transistors (here transistor 1030) is configured to receive a first oscillation signal 1012 at a first control terminal 1032. The other transistor (here transistor 1040) is configured to receive a second oscillation signal 1013 at a second control terminal 1042. The second oscillation signal 1013 may, e.g., be phase-inverted to the first oscillation signal 1012.

A second output 1050 is coupled to output terminals 1033, 1043 of the transistors 1030, 1040 to supply a signal 1015-2 for controlling a second signal generation element of the DAC cell (e.g. a second switched transistor).

Accordingly, controlling signals for the two second signal generation elements of a differential DAC cell may be generated.

The apparatus 1000 may optionally further comprise a buffer 1060 which is coupled between the output terminals 1033, 1043 of the transistors 1030, 1040 and the second output 1050. As indicated in FIG. 10, the buffer 1060 may, e.g., be implemented by two cascades 1061, 1062 of transistors (between a supply voltage and ground) which are coupled in series.

The apparatus 1000 allows for dynamic logic control of a DAC cell.

Generally speaking, some examples relate to a means for controlling a DAC cell of a DAC circuit. The means for controlling comprises a means for receiving a state signal indicative of an activation or de-activation of the DAC cell. Further, the means for controlling comprises a means for supplying the state signal as a signal for controlling a first signal generation element of the DAC cell. The means for controlling further comprises two means for switching of different conductivity types which are coupled in parallel. Input means of the means for switching are coupled to the means for receiving the state signal, wherein one of the means for switching is configured to receive a first oscillation signal at a first control means, and wherein the other means for switching is configured to receive a second oscillation signal at a second control means. Additionally, the means for controlling comprises a means for supplying a signal for controlling a second signal generation element of the DAC cell, wherein the means for supplying the signal for controlling the second signal generation element is coupled to output means of the means for switching.

In some examples, the means for controlling further comprise a buffering means coupled between the output means of the means for switching and the he means for supplying the signal for controlling the second signal generation element.

The means for controlling may be implemented by an apparatus for controlling a DAC cell of a DAC circuit described above or below (e.g. FIG. 10). The means for receiving may be implemented by an input described above or below (e.g. FIG. 10). The means for supplying the state signal as a signal for controlling a first signal generation element of the DAC cell may be implemented by a first output described above or below (e.g. FIG. 10). The means for switching of different conductivity types which are coupled in parallel may be implemented by two transistors coupled in parallel as described above or below (e.g. FIG. 10). The means for supplying a signal for controlling a second signal generation element of the DAC cell may be implemented by an output described above or below (e.g. FIG. 10).

In the following, further details of the voltage protection circuit are discussed in connection with FIGS. 11 to 13. In other words, the upper part of the DPA which provides the (high) voltage robustness is discussed the following. As discussed above in connection with FIG. 2, the voltage protection circuit may be implemented by one or more transistors coupled in series between the common output node of the plurality of DAC cells and the output node of the DAC circuit.

In the example of FIG. 2, the voltage protection circuit 150 consists of a pair of two thick oxide NMOS transistor stacks (because of the implementation as differential circuit). However, it is to be noted that the voltage protection circuit 150 may instead also comprise a pair of NMOS or DEMOS (Drain Extended MOS) transistors or any other type of high-voltage device. For example, it may also consist of a pair of transistor stacks with an arbitrary number of transistors of any of these devices. The choice depends on the required voltage robustness and on the available devices.

For higher flexibility, e.g. in optimizing current consumption in power back-off, the voltage protection circuit may comprise a plurality of voltage protection sub-circuits, wherein the voltage protection circuit is configured to activate one or more of the voltage protection subcircuits based on a desired output power of an output signal at the output node of the DAC circuit. That is, the upper part of the DPA is divided into sub-blocks, which can be independently turned on and off. By selecting the number of active voltage protection sub-circuits based on the desired output power of the output signal of the DAC circuit, current consumption may be minimized. Examples are discussed in the following in connection with FIGS. 11 to 13.

Figure 11:
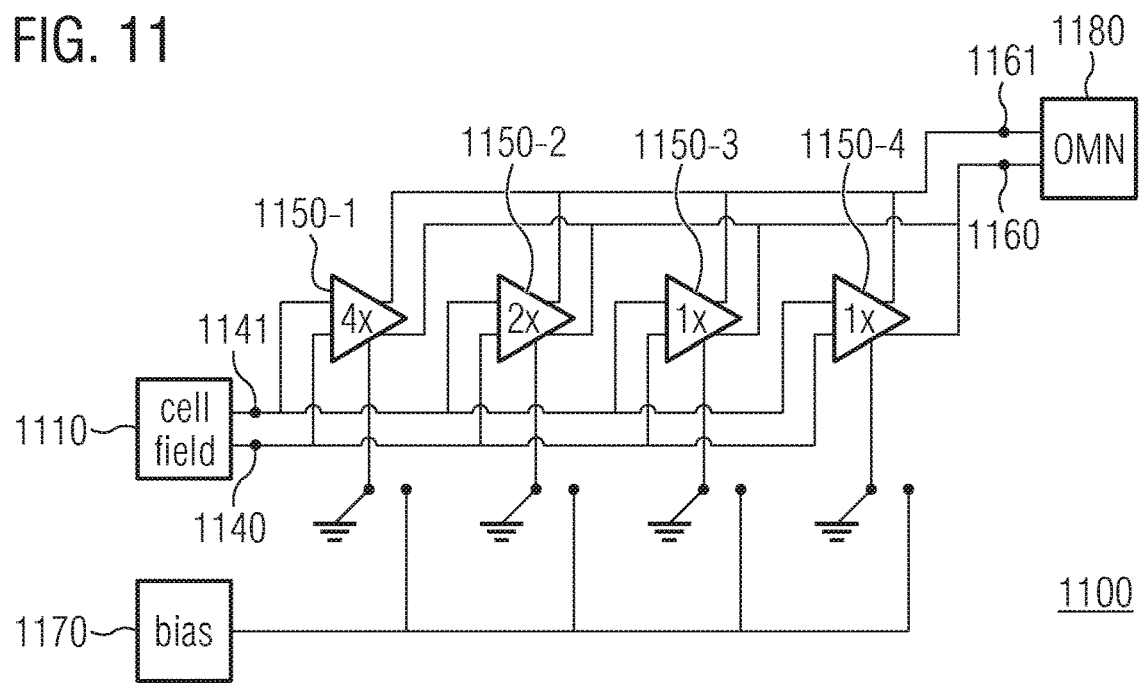
FIG. 11 illustrates an example of a voltage protection circuit.

FIG. 11 illustrates an example of a voltage protection circuit 1100, with four voltage protection sub-circuits 1150-1, 1150-2, 1150-3, 1150-4. In the example of FIG. 11, the size of the four voltage protection sub-circuits 1150-1, 1150-2, 1150-3, 1150-4 is binary scaled. That is, the number of transistors per voltage protection sub-circuits, which are coupled in series, is binary scaled. However, the size scaling may also be different. The four voltage protection sub-circuits 1150-1, 1150-2, 1150-3, 1150-4 are connected between the output nodes 1160, 1161 of the DAC circuit and the common output nodes 1140, 1141 of the plurality of DAC cells 1110. That is, the plurality of DAC cells 1110 are short-circuited. The output nodes 1160, 1161 of the DAC circuit are coupled to matching network 1180.

Further, a biasing module 1170 is illustrated for supplying the defined potentials to the respective control terminals of the transistors of the four voltage protection sub-circuits 1150-1, 1150-2, 1150-3, 1150-4 if they are activated. The activation of single ones of the four voltage protection sub-circuits 1150-1, 1150-2, 1150-3, 1150-4 is based on the desired output power of the output signal at the output nodes 1160, 1161 of the DAC circuit.

Figure 12:
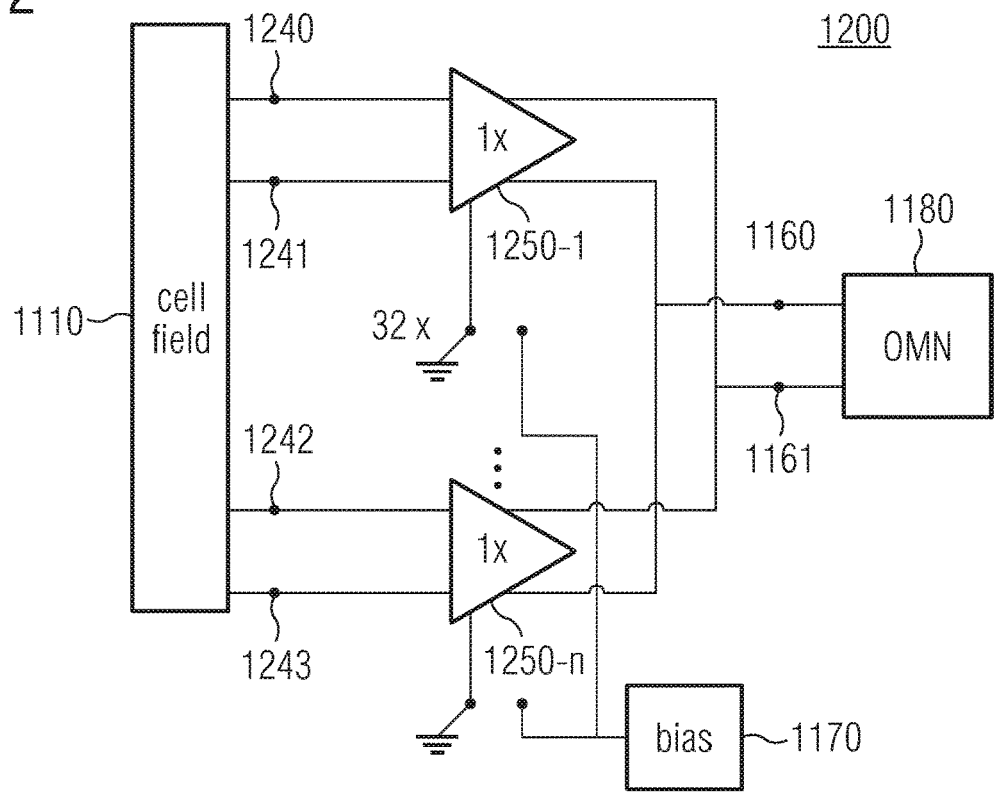
FIG. 12 illustrates another example of a voltage protection circuit.

An alternative implementation, in which each cell line of the plurality of DAC cells is assigned to an individual voltage protection sub-circuit is illustrated in FIG. 12. The voltage protection circuit 1200 illustrated in FIG. 12 comprises a voltage protection sub-circuit 1250-1, . . . , 1250-n for each cell line of the plurality of DAC cells 1110 (i.e. for each cell line of the DAC cell field). For example, if the DAC cell field comprises 32 lines, the voltage protection circuit 1200 comprises 32 voltage protection sub-circuits. Accordingly, for n cell lines 2n common output nodes of the plurality of DAC cells are provided for a differential implementation. The individual voltage protection sub-circuit is coupled between the two common output nodes of the respective DAC cell line and the output nodes of the DAC circuit. For example, voltage protection sub-circuit 1250-1 is coupled between the two common output nodes 1240, 1241 of the first DAC cell line and the output nodes 1160, 1161 of the DAC circuit, whereas voltage protection sub-circuit 1250-n is coupled between the two common output nodes 1242, 1243 of the n-th DAC cell line and the output nodes 1160, 1161 of the DAC circuit.

Figure 13:
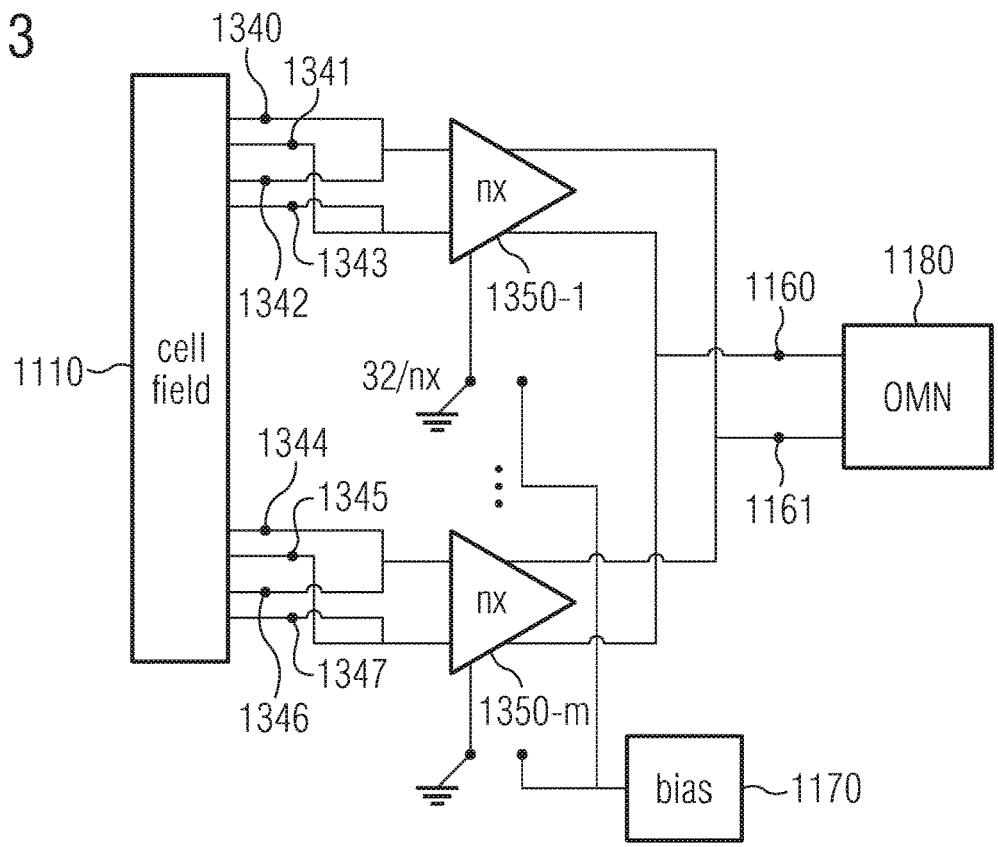
FIG. 13 illustrates still another example of a voltage protection circuit.

However, also groups of cell lines of the plurality of DAC cells may be assigned to an individual voltage protection sub-circuit as illustrated in FIG. 13. For example, if the DAC cell field comprises 32 lines, the voltage protection circuit 1200 may comprise 16 voltage protection sub-circuits if two cell lines share one voltage protection sub-circuit. However, any number of cell lines may share one voltage protection sub-circuit. Accordingly, the respective voltage protection sub-circuit may be coupled to the common output nodes of the DAC cell lines.

In the example of FIG. 13, two cell lines share one voltage protection sub-circuit. That is, voltage protection sub-circuit 1350-1 is coupled between the two common output nodes 1340, 1341 of the first DAC cell line, the two common output nodes 1342, 1343 of the second DAC cell line and the output nodes 1160, 1161 of the DAC circuit, whereas voltage protection sub-circuit 1350-m is coupled between the two common output nodes 1344, 1345 of the second last DAC cell line, the two common output nodes 1346, 1347 of the last DAC cell line and the output nodes 1160, 1161 of the DAC circuit.

As indicated by the examples in FIGS. 11 to 13, dividing the voltage protection circuit in individually controllable sub-circuits may allow to adapt voltage protection for the DAC cells to the desired output power of the DAC circuit's output signal.

Figure 14:
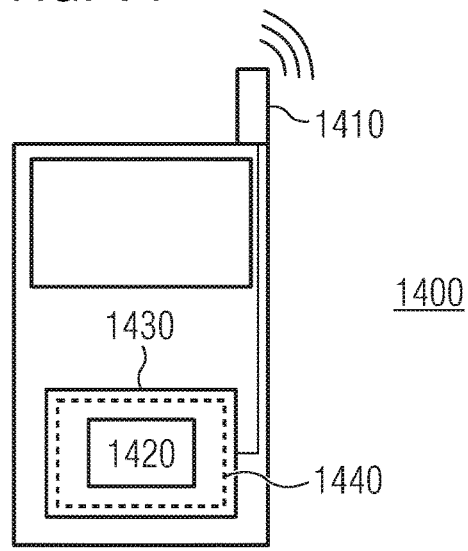
FIG. 14 illustrates an example of a mobile communications device comprising a DAC circuit or an apparatus for controlling a DAC cell.

An example of an implementation using a DAC circuit according to one or more aspects of the proposed concept or one or more examples described above is illustrated in FIG. 14. FIG. 14 schematically illustrates an example of a mobile communications device or mobile phone or user equipment 1400 comprising a DAC circuit 1420 according to an example described herein. The DAC circuit 1420 may be comprised by a transmitter 1430, or an apparatus for providing a RF transmit signal 1440 (e.g. according to examples described herein). The apparatus for providing a RF transmit signal 1440 itself may be comprised by the transmitter 1430. An antenna element 1410 of the mobile communications device 1400 may be coupled to the transmitter 1430. To this end, mobile communications devices may be provided with improved transmit stages.

Figure 15:
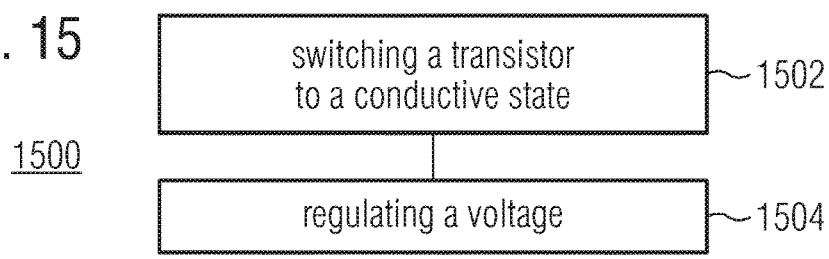
FIG. 15 illustrates a flowchart of an example of a method for operating a DAC circuit.

An example of a method 1500 for operating a DAC circuit is illustrated by means of a flowchart in FIG. 15. The DAC circuit comprises one or more (e.g. a plurality of) DAC cells comprising a first DAC cell. The method 1500 comprises switching 1502 a first transistor of the first DAC cell to a conductive state when the first DAC cell is activated, wherein a first terminal of the first transistor is coupled to a defined potential, and wherein a second terminal of the first transistor is coupled to a common output node of the one or more DAC cells. Moreover, the method 1500 comprises regulating (e.g. limiting) 1504 a voltage between an output node of the DAC circuit and the defined potential using a voltage protection circuit coupled between the common output node of the one or more DAC cells and the common output node.

More details and aspects of the method are mentioned in connection with the proposed concept or one or more examples described above (e.g. FIGS. 1 to 13). The method may comprise one or more additional optional features corresponding to one or more aspects of the proposed concept or one or more examples described above.

Figure 16:
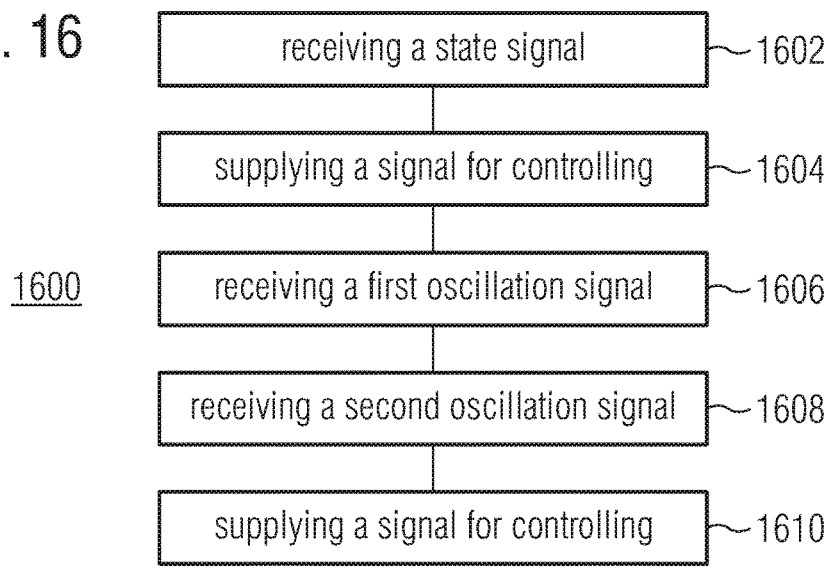
FIG. 16 illustrates a flowchart of an example of a method for controlling a DAC cell.

An example of a method 1600 for controlling a DAC cell of a DAC circuit is illustrated by means of a flowchart in FIG. 16. The method 1600 comprises receiving 1602 a state signal indicative of an activation or de-activation of the DAC cell at an input. Moreover, the method 1600 comprises supplying 1604 the state signal as a signal for controlling a first signal generation element of the DAC cell at a first output. The method 1600 further comprises receiving 1606 a first oscillation signal at a first control terminal of one of two transistors of different conductivity types which are coupled in parallel. Input terminals of the transistors are coupled to the input. Further, the method 1600 comprises receiving 1608 a second oscillation signal at a second control terminal of the other transistor. The method 1600 additionally comprises supplying 1610 a signal for controlling a second signal generation element of the DAC cell at a second output coupled to output terminals of the transistors.

Figure 10:
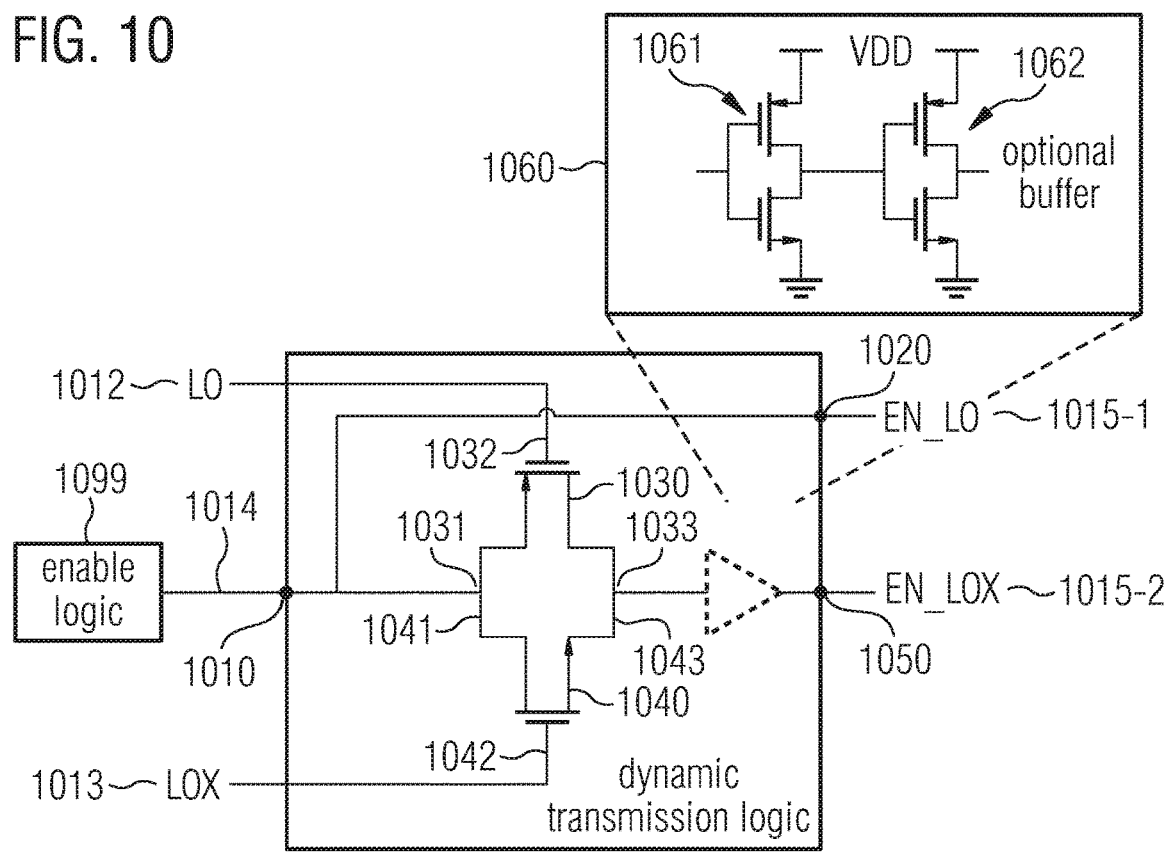
FIG. 10 illustrates another example of an apparatus for controlling a DAC cell.

More details and aspects of the method are mentioned in connection with the proposed concept or one or more examples described above (e.g. FIG. 10). The method may comprise one or more additional optional features corresponding to one or more aspects of the proposed concept or one or more examples described above.

The examples as described herein may be summarized as follows:

Example 1 is a DAC circuit comprising one or more DAC cells, wherein a first DAC cell comprises a first transistor which is configured to be switched to a conductive state when the first DAC cell is activated, wherein a first terminal of the first transistor is coupled to a defined potential, and wherein a second terminal of the first transistor is coupled to a common output node of the one or more DAC cells; and a voltage protection circuit coupled between the common output node of the one or more of DAC cells and an output node of the DAC circuit to regulate a voltage between the common output node and the defined potential.

In example 2, the first DAC cell of the DAC circuit of example 1 further comprises a switchable current source coupled to the common output node.

In example 3, the switchable current source of the DAC circuit of example 2 is configured to supply a bias current to the common output node when the first DAC cell is de-activated.

In example 4, the switchable current source of the DAC circuit of example 2 or example 3 comprises a transistor coupled between the defined potential and the common output node.

In example 5 the first DAC cell of the DAC circuit of example 4 further comprises a first auxiliary voltage protection circuit coupled between the transistor of the switchable current source and the common output node to regulate a voltage across the transistor of the switchable current source.

In example 6, the switchable current source of the DAC circuit of any of examples 3 to 5 is further configured to adjust a value of the bias current.

In example 7, further DAC cells of the one or more DAC cells of the DAC circuit of any of examples 2 to 6 comprise a respective switchable current source, wherein a number of switchable current sources supplying the bias current to the common output node is selected based on a digital amplitude control signal.

In example 8, the voltage protection circuit of the DAC circuit of any of the preceding examples comprises one or more transistors coupled in series between the common output node of the one or more DAC cells and the output node of the DAC circuit.

In example 9, control terminals of the voltage protection circuit's one or more transistors of the DAC circuit of example 8 are configured to be coupled to respective defined potentials.

In example 10, the voltage protection circuit of the DAC circuit of any of the preceding examples comprises a plurality of voltage protection sub-circuits, wherein the voltage protection circuit is configured to activate one or more of the voltage protection sub-circuits based on a desired output power of an output signal at the output node of the DAC circuit.

In example 11, the first DAC cell of the DAC circuit of any of the preceding examples further comprises a second auxiliary voltage protection circuit coupled between the first transistor and the common output node, wherein the second auxiliary voltage protection circuit is configured to regulate a voltage across the first transistor.

In example 12, the first DAC cell of the DAC circuit of any of the preceding examples further comprises a cell control module configured to switch the first transistor to the conductive state based on an oscillation signal.

In example 13, the cell control module of the DAC circuit of example 12 is further configured to control the switchable current source.

In example 14, the first DAC cell of the DAC circuit of any of the preceding examples further comprises a second transistor, wherein a first terminal of the second transistor is coupled to the defined potential and a second terminal of the second transistor is coupled to a second common output node of the one or more DAC cells, wherein the second transistor is configured to be switched to the conductive state when the first DAC cell is activated, and wherein the voltage protection circuit is further coupled between the second common output node and the output node of the DAC circuit to regulate a voltage between the second common output node and the defined potential.

In example 15, the first DAC cell of the DAC circuit of example 14 further comprises a second switchable current source coupled to the second common output node.

In example 16, the second switchable current source of the DAC circuit of example 15 is configured to supply a bias current to the second common output node when the first DAC cell is de-activated.

In example 17, the voltage protection circuit of the DAC circuit of any of examples 14 to 16 comprises one or more transistors coupled in series between the second common output node and the output node of the DAC circuit.

In example 18, the cell control module of the DAC circuit of any of examples 14 to 17 is configured to switch the second transistor to the conductive state based on a second oscillation signal.

In example 19, the cell control module of the DAC circuit of any of examples 14 to 18 is configured to switch only one of the first transistor and the second transistor of the first DAC cell to the conductive state at the same time.

In example 20, a number of activated DAC cells of the DAC circuit of any of the preceding examples is selected based on a digital amplitude control signal.

In example 21, a number of de-activated DAC cells of the DAC circuit of example 20 is selected based on the digital amplitude control signal.

Example 22 is an apparatus for providing a RF transmit signal, comprising: a DAC circuit according to any of examples 1 to 21 which is configured to generate an analog RF transmit signal based on a digital baseband transmit signal; and a matching circuit coupled to the DAC circuit, wherein the matching circuit is configured to present a defined inductance to the DAC circuit.

In example 23, the DAC circuit and the matching circuit of the apparatus of example 22 are arranged on the same semiconductor substrate.

In example 24, the DAC circuit and the matching circuit of the apparatus of example 22 are arranged on different semiconductor substrates.

Example 25 is an apparatus for controlling a DAC cell of a DAC circuit, comprising: an input configured to receive a state signal indicative of an activation or de-activation of the DAC cell; a first output configured to supply the state signal as a signal for controlling a first signal generation element of the DAC cell; two transistors of different conductivity types which are coupled in parallel, wherein input terminals of the transistors are coupled to the input, wherein one of the transistors is configured to receive a first oscillation signal at a first control terminal, and wherein the other transistor is configured to receive a second oscillation signal at a second control terminal; and a second output coupled to output terminals of the transistors to supply a signal for controlling a second signal generation element of the DAC cell.

In example 26, the state signal for the apparatus of example 25 is based on an output signal of a decoder of the DAC circuit.

In example 27, the apparatus of example 25 or example 26 further comprises a buffer coupled between the output terminals of the transistors and the second output.

In example 28, the second oscillation signal for the apparatus of any of example 25 to 27 is phase-inverted to the first oscillation signal.

Example 29 is a DAC circuit comprising an apparatus for controlling a DAC cell according to any of example 25 to 28.

Example 30 is a transmitter comprising a DAC circuit according to any of examples 1 to 21, an apparatus for providing a RF transmit signal according to any of examples 22 to 24, or a DAC circuit according to example 29.

Example 31 is a mobile communications device comprising an apparatus for providing a RF transmit signal according to any of examples 22 to 24, or a transmitter according to example 30.

In example 32, the mobile communications device of example 31 further comprises at least one antenna element coupled to the apparatus for providing a RF transmit signal, or to the transmitter.

Example 33 is a means for digital-to-analog conversion, comprising: one or more cellular means for digital-to-analog conversion, wherein a first cellular means for digital-to-analog conversion comprises a first transistor which is configured to be switched to a conductive state when the first cellular means for digital-to-analog conversion is activated, wherein a first terminal of the first means for switching is coupled to a defined potential, and wherein a second terminal of the first means for switching is coupled to a common output node of the one or more cellular means for digital-to-analog conversion; and a means for voltage protection coupled between the common output node of the one or more cellular means for digital-to-analog conversion and an output node of the means for digital-to-analog conversion to regulate a voltage between the common output node and the defined potential.

In example 34, the first cellular means for digital-to-analog conversion of the means for digital-to-analog conversion of example 33 further comprises a means for selectively coupling a current source to the common output node.

Example 35 is a means for controlling a DAC cell of a DAC circuit, comprising: a means for receiving a state signal indicative of an activation or de-activation of the DAC cell; a means for supplying the state signal as a signal for controlling a first signal generation element of the DAC cell; two means for switching of different conductivity types which are coupled in parallel, wherein input means of the means for switching are coupled to the means for receiving the state signal, wherein one of the means for switching is configured to receive a first oscillation signal at a first control means, and wherein the other means for switching is configured to receive a second oscillation signal at a second control means; and a means for supplying a signal for controlling a second signal generation element of the DAC cell, wherein the means for supplying the signal for controlling the second signal generation element is coupled to output means of the means for switching.

In example 36, the means of example 35 further comprises a buffering means coupled between the output means of the means for switching and the he means for supplying the signal for controlling the second signal generation element.

Example 37 is a method for operating a DAC circuit which comprises one or more DAC cells comprising a first DAC cell, the method comprising: switching a first transistor of the first DAC cell to a conductive state when the first DAC cell is activated, wherein a first terminal of the first transistor is coupled to a defined potential, and wherein a second terminal of the first transistor is coupled to a common output node of the one or more DAC cells; and regulating a voltage between an output node of the DAC circuit and the defined potential using a voltage protection circuit coupled between the common output node of the one or more DAC cells and the common output node.

In example 38, the method of example 37 further comprises supplying a bias current to the common output node when the first DAC cell is de-activated using a switchable current source of the first DAC cell, wherein the switchable current source is coupled to the common output node.

In example 39, the method of example 38 further comprises regulating a voltage across a transistor of the switchable current source using a first auxiliary voltage protection circuit of the first DAC cell which is coupled between the transistor of the switchable current source and the common output node.

In example 40, the method of example 38 or example 39 further comprises adjusting a value of the bias current.

In example 41, further DAC cells of the one or more of DAC cells comprise a respective switchable current source, and the method of any of examples 38 to 40 further comprise selecting a number of switchable current sources supplying the bias current to the common output node based on a digital amplitude control signal.

In example 42, the voltage protection circuit comprises one or more transistors coupled in series between the common output node of the one or more DAC cells and the output node of the DAC circuit, and the method of any of the preceding examples further comprises coupling control terminals of the voltage protection circuit's one or more transistors to respective defined potentials.

In example 43, the voltage protection circuit comprises a plurality of voltage protection sub-circuits, and the method of any of the preceding examples further comprises activating one or more of the voltage protection sub-circuits based on a desired output power of an output signal at the output node of the DAC circuit.

In example 44, the method of any of the preceding examples further comprises regulating a voltage across the first transistor using a second auxiliary voltage protection circuit of the first DAC cell which is coupled between the first transistor and the common output node.

In example 45, the method of any of the preceding examples further comprises switching the first transistor to the conductive state based on an oscillation signal.

In example 46, the first DAC cell further comprises a second transistor, wherein a first terminal of the second transistor is coupled to the defined potential and a second terminal of the second transistor is coupled to a second common output node of the one or more DAC cells, wherein the voltage protection circuit is further coupled between the second common output node and the output node of the DAC circuit, and the method of any of the preceding examples further comprises: switching the second transistor to the conductive state when the first DAC cell is activated; and regulating a voltage between the second common output node and the defined potential using the voltage protection circuit.

In example 47, the method of example 46 further comprises supplying a bias current to the second common output node when the first DAC cell is de-activated using a second switchable current source of the first DAC cell, wherein the second switchable current source is coupled to the second common output node.

In example 48, the method of example 46 or example 47 further comprises switching the second transistor to the conductive state based on a second oscillation signal.

In example 49, the method of any of examples 46 to 48 further comprises switching only one of the first transistor and the second transistor of the first DAC cell to the conductive state at the same time.

In example 50, the method of any of the preceding examples further comprises selecting a number of activated DAC cells based on a digital amplitude control signal.

In example 51, the method of example 50 further comprises selecting a number of de-activated DAC cells based on the digital amplitude control signal.

Example 52 is a method for controlling a DAC cell of a DAC circuit, comprising: receiving a state signal indicative of an activation or de-activation of the DAC cell at an input; supplying the state signal as a signal for controlling a first signal generation element of the DAC cell at a first output; receiving a first oscillation signal at a first control terminal of one of two transistors of different conductivity types which are coupled in parallel, wherein input terminals of the transistors are coupled to the input; receiving a second oscillation signal at a second control terminal of the other transistor; and supplying a signal for controlling a second signal generation element of the DAC cell at a second output coupled to output terminals of the transistors.

In example 53, the state signal in the method of example 52 is based on an output signal of a decoder of the DAC circuit.

In example 54, the second oscillation signal in the method of example 52 or example 53 is phase-inverted to the first oscillation signal.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a sensor signal", "means for generating a transmit signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and nonvolatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded. Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other example examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A digital-to-analog converter circuit, comprising:
    one or more digital-to-analog converter cells, wherein a first digital-to-analog converter cell comprises a first transistor which is configured to be switched to a conductive state when the first digital-to-analog converter cell is activated, wherein a first terminal of the first transistor is coupled to a defined potential, and wherein a second terminal of the first transistor is coupled to a common output node of the one or more digital-to-analog converter cells, and
    a voltage protection circuit coupled between the common output node of the one or more of digital-to-analog converter cells and an output node of the digital-to-analog converter circuit to regulate a voltage between the common output node and the defined potential.

2. The digital-to-analog converter circuit of claim 1, wherein the first digital-to-analog converter cell further comprises a switchable current source coupled to the common output node.

3. The digital-to-analog converter circuit of claim 2, wherein the switchable current source is configured to supply a bias current to the common output node when the first digital-to-analog converter cell is de-activated.

4. The digital-to-analog converter circuit of claim 2, wherein the switchable current source comprises a transistor coupled between the defined potential and the common output node.

5. The digital-to-analog converter circuit of claim 4, wherein the first digital-to-analog converter cell further comprises a first auxiliary voltage protection circuit coupled between the transistor of the switchable current source and the common output node to regulate a voltage across the transistor of the switchable current source.

6. The digital-to-analog converter circuit of claim 3, wherein the switchable current source is further configured to adjust a value of the bias current.

7. The digital-to-analog converter circuit of claim 2, wherein further digital-to-analog converter cells of the one or more digital-to-analog converter cells comprise a respective switchable current source, and wherein a number of switchable current sources supplying the bias current to the common output node is selected based on a digital amplitude control signal.

8. The digital-to-analog converter circuit of claim 1, wherein the voltage protection circuit comprises one or more transistors coupled in series between the common output node of the one or more digital-to-analog converter cells and the output node of the digital-to-analog converter circuit.

9. The digital-to-analog converter circuit of claim 1, wherein the voltage protection circuit comprises a plurality of voltage protection sub-circuits, and wherein the voltage protection circuit is configured to activate one or more of the voltage protection sub-circuits based on a desired output power of an output signal at the output node of the digital-to-analog converter circuit.

10. The digital-to-analog converter circuit of claim 1, wherein the first digital-to-analog converter cell further comprises a second auxiliary voltage protection circuit coupled between the first transistor and the common output node, and wherein the second auxiliary voltage protection circuit is configured to regulate a voltage across the first transistor.

11. The digital-to-analog converter circuit of claim 1, wherein the first digital-to-analog converter cell further comprises a cell control module configured to switch the first transistor to the conductive state based on an oscillation signal.

12. The digital-to-analog converter circuit of claim 11, wherein the cell control module is further configured to control the switchable current source.

13. The digital-to-analog converter circuit of claim 1, wherein the first digital-to-analog converter cell further comprises a second transistor, wherein a first terminal of the second transistor is coupled to the defined potential and a second terminal of the second transistor is coupled to a second common output node of the one or more digital-to-analog converter cells, wherein the second transistor is configured to be switched to the conductive state when the first digital-to-analog converter cell is activated, and wherein the voltage protection circuit is further coupled between the second common output node and the output node of the digital-to-analog converter circuit to regulate a voltage between the second common output node and the defined potential.

14. The digital-to-analog converter circuit of claim 13, wherein the first digital-to-analog converter cell further comprises a second switchable current source coupled to the second common output node.

15. The digital-to-analog converter circuit of claim 14, wherein the second switchable current source is configured to supply a bias current to the second common output node when the first digital-to-analog converter cell is de-activated.

16. The digital-to-analog converter circuit of claim 13, wherein the voltage protection circuit comprises one or more transistors coupled in series between the second common output node and the output node of the digital-to-analog converter circuit.

17. An apparatus for providing a radio frequency transmit signal, comprising:
    a digital-to-analog converter circuit according to claim 1 which is configured to generate an analog radio frequency transmit signal based on a digital baseband transmit signal, and
    a matching circuit coupled to the digital-to-analog converter circuit, wherein the matching circuit is configured to present a defined inductance to the digital-to-analog converter circuit.

18. An apparatus for controlling a digital-to-analog converter cell of a digital-to-analog converter circuit, comprising:

an input configured to receive a state signal indicative of an activation or de-activation of the digital-to-analog converter cell, a first output configured to supply the state signal as a signal for controlling a first signal generation element of the digital-to-analog converter cell, two transistors of different conductivity types which are coupled in parallel, wherein input terminals of the transistors are coupled to the input, wherein one of the transistors is configured to receive a first oscillation signal at a first control terminal, and wherein the other transistor is configured to receive a second oscillation signal at a second control terminal, and a second output coupled to output terminals of the transistors to supply a signal for controlling a second signal generation element of the digital-to-analog converter cell.

19. The apparatus of claim 18, wherein the state signal is based on an output signal of a decoder of the digital-to-analog converter circuit.

20. The apparatus of claim 18, further comprising a buffer coupled between the output terminals of the transistors and the second output.

21. The apparatus of any of claim 18, wherein the second oscillation signal is phase-inverted to the first oscillation signal.

22. A method for operating a digital-to-analog converter circuit which comprises one or more digital-to-analog converter cells comprising a first digital-to-analog converter cell, the method comprising:

switching a first transistor of the first digital-to-analog converter cell to a conductive state when the first digital-to-analog converter cell is activated, wherein a first terminal of the first transistor is coupled to a defined potential, and wherein a second terminal of the first transistor is coupled to a common output node of the one or more digital-to-analog converter cells, and regulating a voltage between an output node of the digital-to-analog converter circuit and the defined potential using a voltage protection circuit coupled between the common output node of the one or more digital-to-analog converter cells and the common output node.

23. The method of claim 22, wherein the method further comprises supplying a bias current to the common output node when the first digital-to-analog converter cell is de-activated using a switchable current source of the first digital-to-analog converter cell, wherein the switchable current source is coupled to the common output node.

24. The method of claim 22, wherein further digital-to-analog converter cells of the one or more of digital-to-analog converter cells comprise a respective switchable current source, and wherein the method further comprise selecting a number of switchable current sources supplying the bias current to the common output node based on a digital amplitude control signal.

25. The method of claim 22, wherein the voltage protection circuit comprises a plurality of voltage protection sub-circuits, and wherein the method further comprises activating one or more of the voltage protection sub-circuits based on a desired output power of an output signal at the output node of the digital-to-analog converter circuit.

* * * * *